US012644047B2

(12) United States Patent
Emrick et al.

(10) Patent No.: US 12,644,047 B2
(45) Date of Patent: Jun. 2, 2026

(54) MACROMOLECULAR AMMONIUM AND GUANIDINIUM HALIDES FOR TUNING COLOR OF PEROVSKITE NANOCRYSTALS

(71) Applicant: University of Massachusetts, Boston, MA (US)

(72) Inventors: Todd Emrick, South Deerfield, MA (US); Christopher Cueto, Amherst, MA (US)

(73) Assignee: University of Massachusetts, Boston, MA (US)

( * ) Notice: Subject to any disclaimer, the term of this patent is extended or adjusted under 35 U.S.C. 154(b) by 560 days.

(21) Appl. No.: 18/131,414

(22) Filed: Apr. 6, 2023

(65) Prior Publication Data

US 2023/0323200 A1 Oct. 12, 2023

Related U.S. Application Data

(60) Provisional application No. 63/328,853, filed on Apr. 8, 2022.

(51) Int. Cl.

| | |
|---|---|
| ***C09K 11/66*** | (2006.01) |
| ***B82Y 30/00*** | (2011.01) |
| ***B82Y 40/00*** | (2011.01) |
| ***C09K 11/02*** | (2006.01) |
| ***H10K 50/115*** | (2023.01) |
| ***H10K 85/10*** | (2023.01) |

(52) U.S. Cl.

CPC ............ *C09K 11/663* (2013.01); *B82Y 30/00* (2013.01); *B82Y 40/00* (2013.01); *C09K 11/025* (2013.01); *H10K 50/115* (2023.02); *H10K 85/151* (2023.02)

(58) Field of Classification Search

CPC ............................ C09K 11/025; C09K 11/663

See application file for complete search history.

(56) References Cited

U.S. PATENT DOCUMENTS 7,847,027 B2 * 12/2010 Ghyzel .................... C08F 8/44 428/407

FOREIGN PATENT DOCUMENTS

CN 102516480 A 6/2012
CN 113308244 * 8/2021

OTHER PUBLICATIONS

Kim. Functional polymers for growth and stabilization of CsPbBr3 perovskite nanoparticles. Chem. Commun., 2019, 55, 1833-1836 (and Supplemental Information). (Year: 2019).*

Wang. Enhanced Stabilization and Easy Phase Transfer of CsPbBr3 Perovskite Quantum Dots Promoted by High-Affinity Polyzwitterionic Ligands. JACS. Jun. 26, 2020. vol. 142 Issue 29. pp. 12669-12680 (Year: 2020).*

(Continued)

*Primary Examiner* — Matthew E. Hoban

(74) *Attorney, Agent, or Firm* — Stites & Harbison, PLLC

(57) ABSTRACT

A composition includes a plurality of lead halide perovskite nanocrystals and an ammonium halide-containing copolymer or a guanidinium halide-containing copolymer. The ammonium halide-containing copolymer and guanidinium halide-containing copolymer can include repeating units defined herein. The composition can be particularly useful for color tuning perovskite nanocrystals, and can be well-suited for light emitting applications, including light emitting diodes.

20 Claims, 7 Drawing Sheets

(56) References Cited

OTHER PUBLICATIONS

Kim. Polymer Zwitterions for Stabilization of CsPbBr3 Perovskite Nanoparticles and Nanocomposite Films. Angew. Chem. Int. Ed. 2020, 59, 10802-10806 (Year: 2020).*

Cohen. ModularZwitterion-FunctionalizedPoly(isopropylmethacrylate) Polymers for Hosting Luminescent Lead Halide Perovskite Nanocrystals. Chem.Mater.2021,33,3779-3790. (Year: 2021).*

Abibula, M. et al., “Rb3Na(H2C3N3O3)4-3H2O with Large Birefringence”, ACS Omega, vol. 4, 2019; pp. 22197-22202.

Akkerman et al., “Tuning the Optical Properties of Cesium Lead Halide Perovskite Nanocrystals by Anion Exchange Reactions”, J. Am. Chem. Soc., vol. 137, 2015; pp. 10276-10281.

Creutz et al., “Anion Exchange in Cesium Lead Halide Perovskite Nanocrystals and Thin Films Using Trimethylsilyl Halide Reagents”, Chem. Mater., vol. 30, 2018; pp. 4887-4891.

Imran et al., “Switchable Anion Exchange in Polymer-Encapsulated APbX3 Nanocrystals Delivers Stable All-Perovskite White Emitters”, ACS Energy Letters, vol. 6, 2021; pp. 2844-2853.

Nedelcu et al., “Fast Anion-Exchange in Highly Luminescent Nanocrystals of Cesium Lead Halide Perovskites (CsPbX3, X =Cl, Br, I)”, Nano Letters, vol. 15, 2015; pp. 5635-5640.

Ravi et al., “To Exchange or Not to Exchange. Suppressing Anion Exchange in Cesium Lead Halide Perovskites with PbSO4-Oleate Capping”, ACS Energy Letter, vol. 3, 2018; pp. 1049-1055.

Sharma et al., “Polystyrene-based self-aggregating polymers based on UPy units”, Polym. Bull., vol. 69, 2012; pp. 911-923.

* cited by examiner

I

**PS-MeN*Boc***

II

PS-NMe$_2$

PS-NH$_3$X

PS-MeNH$_2$X

PS-HNMe$_2$X

PS-NMe$_3$X

**PS-*oct*NMe$_2$X**

III

PBMA-$NH_2$

PBMA-$NH_3X$

IV

PBMA-*Boc*$_2$Gua

PBMA-Gua·HX

MACROMOLECULAR AMMONIUM AND GUANIDINIUM HALIDES FOR TUNING COLOR OF PEROVSKITE NANOCRYSTALS

CROSS REFERENCE TO RELATED APPLICATION

This application claims priority to U.S. Provisional Application No. 63/328,853, filed Apr. 8, 2022, the contents of which is hereby incorporated by reference in its entirety.

FEDERAL RESEARCH STATEMENT

This invention was made with government support under award number 1904660 awarded by the National Science Foundation. The government has certain rights in the invention.

BACKGROUND

Lead halide perovskite nanocrystals (NCs), and in particular all-inorganic $CsPbX_3$ NCs (where X=Cl, Br, I or combinations thereof), have emerged as exciting new semiconductor nanomaterials due to their bright photoluminescence (PL) that rivals earlier generations of metal chalcogenide quantum dots (QDs). The original synthesis of $CsPbX_3$ NC has been followed by advances that enhance their stability, making these types of NCs promising for lighting and display technologies, lasing, and single photon emission sources. For $CsPbX_3$ NCs, the characteristic ionic lattice and weak binding energy make these nanoscale-emitters susceptible to degradation in air and polar solvents, and as such recent research has focused on new ways to harness their surface chemistry towards prolonged emission lifetimes.

It would be desirable to provide an improved method for tuning the bandgap and photoluminescence properties of cesium lead halide perovskite nanocrystals. It would be a further advantage to provide a method for cleanly integrating cesium lead halide perovskite nanocrystals into polymer matrices that can assist in retaining or enhancing the optoelectronic properties.

SUMMARY

A composition comprises a plurality of lead halide perovskite nanocrystals; and an ammonium halide-containing copolymer comprising 1 to 10 mole percent of ammonium halide-containing repeating units or a guanidinium halide-containing copolymer comprising 1 to 10 mole percent of guanidinium halide-containing repeating units.

A method of making a composition comprises combining a plurality of lead halide perovskite nanocrystals; and an ammonium halide-containing copolymer comprising ammonium-halide containing repeating units in an amount of 1 to 10 mole percent or a guanidinium halide-containing copolymer comprising 1 to 10 mole percent of guanidinium halide-containing repeating units under conditions effective to provide the composition.

A light emitting device comprises a first electrode; a second electrode; and a light emitting layer between the first electrode and the second electrode.

The above described and other features are exemplified by the following figures and detailed description.

BRIEF DESCRIPTION OF THE DRAWINGS

The following figures represent exemplary embodiments.

DETAILED DESCRIPTION

Figure 1:
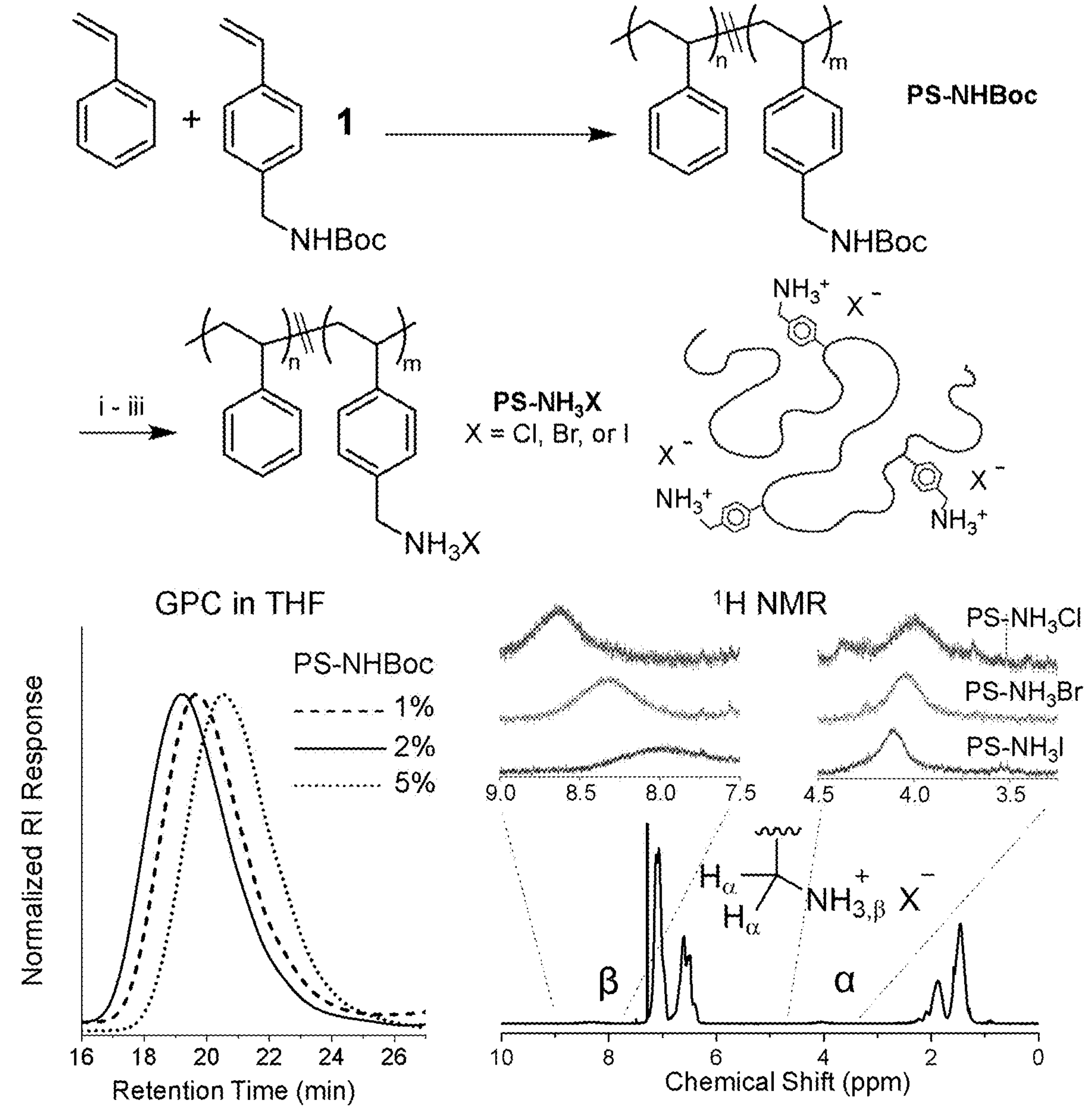
FIG. 1 shows the synthesis of ammonium halide-functionalized polystyrene by emulsion copolymerization and subsequent Boc-deprotection in acidic solution (i. 4M HCl in 1,4-dioxane [X=Cl]; ii. $HBr_{(aq)}$ in dichloromethane [X=Br]; iii. $HI_{(aq)}$ in dichloromethane [X=I]). Bottom-right: GPC curves for boc-protected polystyrene samples containing about 1, 2.5 and 7 mole percent Boc-amine comonomer.

Most reported examples of lead halide perovskite NCs exhibit moderate-to-weak quantum confinement, and as such their PL emission line width and resulting color purity are relatively insensitive to NC size distribution. For perovskite NCs, the position of the valence band maximum and bandgap energy are dictated by halide composition rather than NC size. The compositional window of perovskite NCs, i.e., going from $CsPbCl_3$→$CsPbBr_xCl_{3-x}$→$CsPbBr_3$→$CsPbBr_xI_{3-x}$→$CsPbI_3$, produces PL emission values that span the visible spectrum and permit access to a color palette based on the selection of the lead (II) halide salts employed in their synthesis. PL emission of $CsPbX_3$ NCs has previously been tuned from purple to red using halide selection as the chemical handle. Subsequently, $CsPbX_3$ NCs were found to participate in post-synthesis anion exchange via an external halide source, a finding made possible by the abundance and mobility of vacancies throughout the perovskite lattice. Halide ions can be introduced to the perovskite lattice as metal halide salts, alkylammonium halides, trimethylsilyl halides, or Grignard reagents, with notably rapid exchange that is complete in seconds to minutes. Remarkably, anion exchange does not lead to significant perturbation of NC shape or size, and the resulting PLQY values closely match those reported for NCs synthesized directly by hot injection. That halide exchange occurs readily at room temperature makes it an attractive tool for preparing NCs with well-defined PL emission wavelengths.

The use of macromolecules as the source of halide exchange into perovskite NCs has not been reported, though there are several potential benefits to such a strategy, including ease of purification of the macromolecular halide salt by precipitation and the tailoring of anion exchange kinetics based on polymer diffusion and solvent-induced aggregation state. Polymeric ligands have demonstrated utility for perovskite NC encapsulation and nanocomposite formation. See, e.g., Dey, A. et al.; ACS Nano 2021, 15 (7), 10775-10981; Raja, S. N., et al.; ACS Appl. Mater. Interfaces 2016, 8 (51), 35523-35533; Kim, H., et al.; Chem. Commun. 2019, 55 (12), 1833-1836; Kim, H., et al.; Angew. Chemie Int. Ed. 2020, 59 (27), 10802-10806. However, polymers containing surface-coordinating groups for perovskite NCs (e.g., cations and zwitterions) are generally insoluble in the aliphatic solvents used in the NC synthesis and manipulation. The present inventors have employed copolymers containing small mole percentages of ammonium halide monomer units or guanidinium halide monomer units; these polycations are soluble in organic solvents and prove to be a useful source of halide for exchange with PNCs while also serving as a host matrix for NC encapsulation. Advantageously, these polymers simplify the isolation and purification of primary ammonium halides and guanidinium halides, and their combination with $CsPbBr_3$ perovskite NCs produced bright, narrow line width emission spanning from 440 to 660 nm (i.e., purple-to-red) of the visible spectrum. As will be described for solution complexes of perovskite NCs and polycations, tunable solvent-responsiveness affords temporal control over inter-NC halide exchange, thus enabling white light-emitting solutions and films.

Thus, the present inventors have unexpectedly discovered that post-synthesis anion exchange of all-inorganic cesium lead halide perovskite nanocrystals ($CsPbX_3$ NCs, where X=Cl, Br, and/or I) in the presence of functional polymeric halide derivatives provides a rapid and simple means of tuning their bandgap and photoluminescence emission wavelengths. The present disclosure demonstrates a color shift in $CsPbX_3$ nanocrystals induced by a macromolecular source, for example using ammonium halide-substituted or guanidinium halide-substituted polymer. This strategy, in which new halides are introduced to the perovskite nanocrystals via the pendent groups along the polymer chain, gave access to perovskite-polymer hybrid materials as solutions, thin films, or free-flowing powders. Advantageously, the halide-exchanged nanocrystal products exhibited high photoluminescence quantum yields across the visible spectrum, with kinetics that were tunable based on the solution environment, suggesting an aggregation-inhibited exchange process that affords access to multi-colored solutions and films.

Accordingly, an aspect of the present disclosure is a composition comprising a plurality of lead halide perovskite nanocrystals. As used herein, the term "perovskite" refers to the "perovskite structure" and not specifically to the perovskite material calcium titanate oxide ($CaTiO_3$). Accordingly, a "perovskite" of the present disclosure refers to any materials that have the same type of crystal structure as calcium titanate oxide and of materials in which the bivalent cation is replaced by two separate monovalent cations. The perovskite structure has the general stoichiometry $ABX_3$, where "A" and "B" are cations and "X" is an anion. The "A" and "B" cations can have a variety of charges and in the original perovskite mineral (CaTiO3), the A cation is divalent and the B cation is tetravalent. For the purposes of this disclosure, the perovskite formula includes structures having three (3) or four (4) anions, which can be the same or different, or one or two organic cations, or metal atoms carrying two or three positive charges, in accordance with the formulae presented herein.

The lead halide perovskite nanocrystals of the present disclosure comprise a perovskite of the formula $APbX_3$, or a lead halide nanocrystal of the formula $APb_2X_5$, $A_4PbX_6$, or a combination thereof. In the foregoing formulas, A is a metal cation, an organic cation, or a combination thereof. In an aspect, A is cesium (Cs), a nitrogen-containing organic cationic group (e.g., formamidinium), or a combination thereof. In an aspect, A is Cs. In an aspect, A is a nitrogen-containing organic cationic group. In an aspect A comprises Cs and the nitrogen-containing organic cationic group, preferably a formamidinium cation. The lead halide perovskites include lead (Pb). X in the foregoing formulas is a halide, for example fluoride (F), chloride (Cl), bromide (Br), iodide (I), or a combination thereof. As will be discussed in further detail below, the halide of the perovskite can be selected in order to provide a desired color.

In an aspect, the lead halide perovskite nanocrystals are of the formula $CsPbX_3$, wherein X is a halide. In an aspect, the lead halide nanocrystals are of the formula $CsPb_2X_5$, wherein X is a halide. In an aspect, the lead halide nanocrystals are of the formula $Cs_4PbX_6$, wherein X is a halide. In an aspect, the lead halide nanocrystals are of the formula $FA_xCs_yPb_2X_5$, wherein X is a halide, FA is a formamidinium cation, $0<x<1$, and $0<y<1$, provided that $x+y=1$ (e.g., $FA_{0.8}Cs_{0.2}Pb_2X_5$).

The perovskite nanocrystals can generally be of any shape, for example, spherical, cubic, elongated (e.g., rectangular or rod-like), plate-like, oblong, and the like. In an aspect, the perovskite nanocrystals are cubic in shape, and can thus also be referred to as nanocubes.

The perovskite nanocrystals can have an average particle diameter of 1 to 500 nanometers. When the perovskite nanocrystals have a non-spherical shape, "average particle diameter" can refer to the edge-length of the particle. Within this range, the perovskite nanocrystals can have an average particle diameter of 1 to 10 nanometers. Also within this range, the perovskite nanocrystals can have an average particle diameter of 10 to 500 nanometers. In an aspect, the perovskite nanocrystals can have an average particle diameter of 5 to 100 nanometers, or 5 to 50 nanometers, or 5 to 25 nanometers, or 10 to 25 nanometers, or 10 to 20 nanometers. Average particle diameter can be determined by, for example, dynamic light scattering or image analysis of transmission electron microscope (TEM) images.

The perovskite nanocrystals can further comprise a ligand on the surface of the nanoparticle. The presence of the ligands can aid in achieving a desired solubility of the nanoparticles in a particular solvent. Exemplary ligands can include, but are not limited to, olelylammonium salts and zwitterion-containing small molecule ligands (e.g., based on octadecyl sulfobetaine). Perovskite nanocrystals including such ligands can be prepared, for example, as described in the working examples below. It will be understood that when combined with the ammonium halide-containing polymer as described below, at least a portion of any ligands present can be displaced by the polymer.

In an aspect, the composition can comprise a perovskite nanocrystal having a particular chemical structure. In an aspect, the composition can comprise a blend of perovskite nanocrystals, for example a binary or ternary mixture of two or three types of perovskite nanocrystals. Each of the perovskite nanocrystals of the mixture can be according to the above formula, and may differ, for example, in the identity of the halide.

In addition to the perovskite nanocrystals, the composition further comprises an ammonium halide-containing copolymer or a guanidinium halide-containing copolymer.

In an aspect, the composition comprises the ammonium halide-containing copolymer. The ammonium-halide containing copolymer comprises 1 to 10 mole percent of ammonium halide containing repeating units.

In an aspect, the ammonium halide-containing copolymer comprises repeating units according to Formula (I) and Formula (II)

(I)

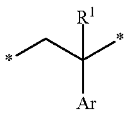

(II)

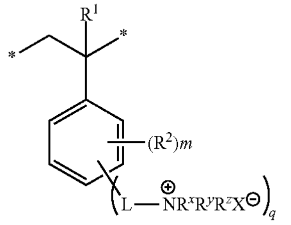

wherein, in Formula I, $R^1$ is hydrogen or a $C_{1-8}$ alkyl group, preferably hydrogen or methyl; and Ar is a substituted or unsubstituted aryl group (e.g., a $C_{6-20}$ aryl group). In an aspect in Formula I, $R^1$ is a $C_{1-6}$ alkyl group, for example a $C_{1-4}$ alkyl group. In an aspect, $R^1$ is hydrogen. In an aspect, Ar is a substituted or unsubstituted phenyl group. For example, the repeating units according to Formula (I) can be of Formula (Ia)

(Ia)

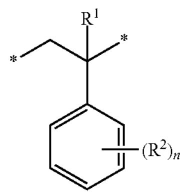

wherein $R^1$ is hydrogen or a $C_{1-8}$ alkyl group, preferably hydrogen or methyl, $R^2$ is independently at each occurrence a substituted or unsubstituted $C_{1-8}$ alkyl group, or a substituted or unsubstituted $C_{2-8}$ alkenyl group, and n is 0 to 5. It will be understood that when n is 0, the phenyl ring is substituted with hydrogen.

In Formula II, $R^1$ is hydrogen or a $C_{1-8}$ alkyl group, preferably hydrogen or methyl; $R^2$ is independently at each occurrence a substituted or unsubstituted $C_{1-8}$ alkyl group, or a substituted or unsubstituted $C_{2-8}$ alkenyl group; L is a linking group; X is a Br, Cl, I, or a combination thereof; m is 0 to 4; and q is 1 to 5. In an aspect, q is 1. Each of $R^x$, $R^y$, and $R^z$ independently comprise hydrogen, a substituted or unsubstituted $C_{1-8}$ alkyl group, or a substituted or unsubstituted $C_{2-8}$ alkenyl group. In an aspect, $R^x$, $R^y$, and $R^z$ can each independently be hydrogen or a $C_{1-18}$ alkyl group, for example a $C_{1-8}$ alkyl group. In an aspect, $R^x$, $R^y$, and $R^z$ can each be hydrogen. In an aspect, at least one of $R^x$, $R^y$, and $R^z$ can be hydrogen. In an aspect, at least two of $R^x$, $R^y$, and $R^z$ can be hydrogen. It will be understood that when m is 0, the phenyl ring is substituted with hydrogen. The linking group L can preferably be a divalent substituted or unsubstituted $C_{1-6}$ alkylene linking group. In a specific aspect, L can be a methylene group. In an aspect, the ammonium halide group can be positioned para relative to the point of connection of the repeating unit to the polymer backbone.

The "*" in the foregoing Formulas indicates a point of attachment to the rest of the polymer backbone.

In an aspect, $R^1$ can be hydrogen, n and m can each be 0, q can be 1, and L can be a $C_{1-6}$ alkylene linking group, preferably a methylene group. For example, the ammonium halide-containing copolymer can comprise repeating units according to Formula (IB) and (IIA)

(IB)

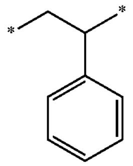

(IIA)

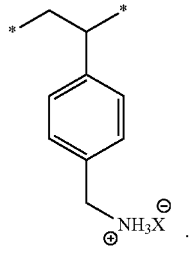

In an aspect, $R^1$ can be hydrogen, n and m can each be 0, q can be 1, L can be a $C_{1-6}$ alkylene linking group, preferably a methylene group, and $R^x$, $R^y$, and $R^z$ can each independently be a $C_{1-8}$ alkyl group, preferably a methyl group. For example, the ammonium halide-containing copolymer can comprise repeating units according to Formula (IB) and (IIB)

(IB)

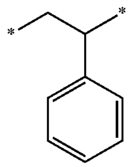

-continued (IIB)

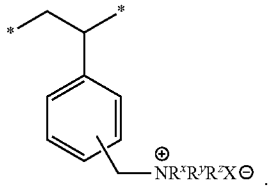

In an aspect, $R^x$ can be a $C_{1-8}$ alkyl group, preferably a methyl group, and each of $R^y$ and $R^z$ can be hydrogen. In an aspect, $R^x$ and $R^y$ can each be a $C_{1-8}$ alkyl group, preferably a methyl group, and $R^z$ can be hydrogen. In aspect, each of $R^x$, $R^y$, and $R^z$ can each be a $C_{1-8}$ alkyl group, preferably a methyl group. In an aspect $R^x$ and $R^y$ can each be a $C_{1-8}$ alkyl group, preferably a methyl group, and $R^z$ can be a $C_{2-8}$ alkyl group, preferably an octyl (Cs alkyl) group.

The repeating units according to Formula (II) (or e.g., (IIA) or (IIB)) can be present in any suitable amount provided that the copolymer is soluble in a hydrocarbon or halogenated organic solvent. For example, the copolymer can have a solubility of up to 100 milligrams per milliliter in an organic solvent such a toluene or chloroform. In an aspect, the repeating units according to Formula (II) can be present in an amount of 1 to 10 mole percent. Within this range, the repeating units according to Formula (II) can be present in an amount of 1 to 8 mole percent, or 1 to 6 mole percent, or 1 to 5 mole percent, or 1 to 4 mole percent, or 1 to 3 mole percent.

The ammonium halide-containing polymer comprising repeating units according to Formula (I) and (II) can be provided by any suitable method. For example, emulsion polymerization can be useful in the preparation of the ammonium halide-containing polymer. An exemplary method based on emulsion polymerization is further described in the working examples below. In an aspect, the ammonium halide-containing polymer can be prepared by hydrolysis of an amidomethylated polystyrene prepared, for example, as described in Polym. J. 2002 345 2002, 34 (5), 363-369, the contents of which is incorporated by reference herein in its entirety.

In an aspect, the ammonium-containing polymer can comprise repeating units according to Formula (I) (e.g., Formula (IA), (IB), or a combination thereof) and Formula (III)

(III)

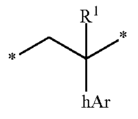

wherein $R^1$ is as defined above, and hAr is a substituted or unsubstituted heteroaryl group, preferably a substituted or unsubstituted heteroaryl group comprising at least one nitrogen atom which can be N—$C_{1-8}$ alkylated or protonated. Exemplary heteroaryl groups can include, but are not limited to, a substituted or unsubstituted pyridinium group, a substituted or unsubstituted imidazolium group, and the like, or a combination thereof. For example, in an aspect, the ammonium-containing polymer can comprise repeating units according to Formula (IIIA), (IIIB), or a combination thereof (IIIA)

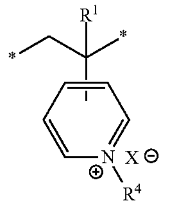

(IIIB)

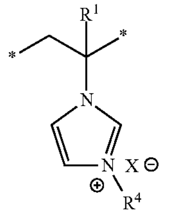

wherein in Formula (IIIA) and (IIIB), $R^1$ is as defined above, and is preferably hydrogen. $R^4$ is independently at each occurrence a hydrogen, a substituted or unsubstituted $C_{1-8}$ alkyl group, or a substituted or unsubstituted $C_{2-8}$ alkenyl group. In an aspect, $R^4$ can be hydrogen. X is as defined above. Specifically, X is a halide, for example Br, Cl, I, or a combination thereof. In an aspect, the repeating units according to Formula (III) can be derived from 2-vinylpyridine, 4-vinylpyridine, 1-vinylimidazole, and the like, or a combination thereof.

In an aspect, the ammonium-containing polymer can comprise repeating units according to Formula (I) (e.g., Formula (IA), (IB), or a combination thereof) and Formula (IV)

(IV)

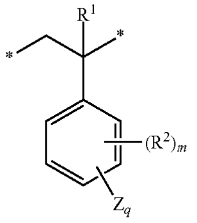

wherein $R^1$, $R^2$, m, and q are as defined above. Z in Formula (IV) is an oligomeric, polymeric, dendritic, or hyperbranched structure comprising a plurality of (e.g., more than one) nitrogen atoms, wherein at least a portion of the nitrogen atoms are present in the form of the corresponding ammonium salts. Exemplary structures Z can include, but are not limited to, polymers according to Formula (II), polymers according to (III), a branched polyethylene imine according to Formula (V), a linear polyethylene imine according to Formula (VI), a poly(N,N-di($C_{1-6}$ alkyl)-3,4-dimethylene pyrrolidinium halide) (e.g., poly(N,N-dimethyl-3,4-dimethylene pyrrolidinium halide according to Formula (VII)), and the like or a combination thereof (V)

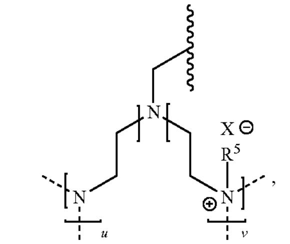

(VI)

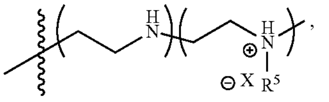

(VII)

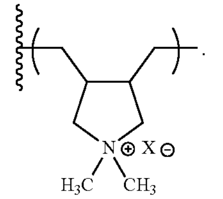

In Formula (V), (VI), and (VII), $R^5$ is independently at each occurrence a hydrogen, a substituted or unsubstituted $C_{1-8}$ alkyl group, or a substituted or unsubstituted $C_{2-8}$ alkenyl group, preferably a hydrogen or a $C_1$-$C_8$ alkyl group. In Formula (V), the dashed bonds indicate the presence of additional repeating units (i.e., to provide dendritic or hyperbranched structures).

In an aspect, the ammonium halide-containing polymer comprises repeating units according to Formula (VIII) and Formula (IX)

(VIII)

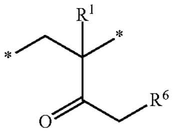

(IX)

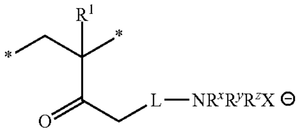

wherein, in Formula I, $R^1$ is hydrogen or a $C_{1-8}$ alkyl group, preferably hydrogen or methyl; and $R^6$ is a substituted or unsubstituted alkyl group (e.g., a $C_{1-20}$ alkyl group). In an aspect in Formula I, $R^1$ is a methyl group. In an aspect, $R^1$ is hydrogen. In an aspect, $R^6$ is a $C_{2-6}$ alkyl group, for example a butyl group. For example, the repeating units according to Formula (VIII) can be of Formula (VIIIa)

(VIIIa)

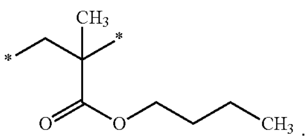

In Formula (IX), $R^1$ is hydrogen or a $C_{1-8}$ alkyl group, preferably hydrogen or methyl; L is a linking group; X is a Br, Cl, I, or a combination thereof. Each of $R^x$, $R^y$, and $R^z$ independently comprise hydrogen, a substituted or unsubstituted $C_{1-8}$ alkyl group, or a substituted or unsubstituted $C_{2-8}$ alkenyl group. In an aspect, $R^x$, $R^y$, and $R^z$ can each independently be hydrogen or a $C_{1-18}$ alkyl group, for example a $C_{1-8}$ alkyl group. In an aspect, $R^x$, $R^y$, and $R^z$ can each be hydrogen. In an aspect, at least one of $R^x$, $R^y$, and $R^z$ can be hydrogen. In an aspect, at least two of $R^x$, $R^y$, and $R^z$ can be hydrogen. The linking group L can preferably be a divalent substituted or unsubstituted $C_1$-6 alkylene linking group. In a specific aspect, L can be an ethylene group.

The "*" in the foregoing Formulas indicates a point of attachment to the rest of the polymer backbone.

In an aspect, $R^1$ can be methyl, L can be a $C_{1-6}$ alkylene linking group, preferably an ethylene group, $R^6$ can be a $C_{1-6}$ alkyl group, preferably a butyl group, and $R^x$, $R^y$, and $R^z$ can each independently be hydrogen or a $C_{1-8}$ alkyl group, preferably hydrogen. For example, the ammonium halide-containing copolymer can comprise repeating units according to Formula (VIIIa) and Formula (IXa)

(VIIIa)

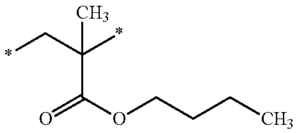

(IXa)

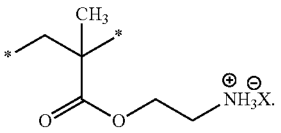

The repeating units according to Formula (IX) can be present in any suitable amount provided that the copolymer is soluble in an aliphatic organic solvent. For example, the copolymer can have a solubility of up to 100 milligrams per milliliter in an organic solvent such a toluene or chloroform. In an aspect, the repeating units according to Formula (IX) can be present in an amount of 1 to 10 mole percent. Within this range, the repeating units according to Formula (II) can be present in an amount of 1 to 8 mole percent, or 1 to 6 mole percent, or 1 to 5 mole percent, or 1 to 4 mole percent, or 1 to 3 mole percent.

In an aspect, the composition comprises the guanidinium halide-containing polymer. The guanidinium halide-containing polymer comprises 1 to 10 mole percent of guanidinium halide containing repeating units.

The guanidinium halide-containing polymer can comprise repeating units according to Formula (VIII) (shown above) and Formula (X)

(X)

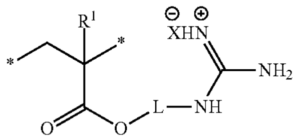

wherein in Formula (X), $R^1$ is hydrogen or a $C_{1-8}$ alkyl group, preferably hydrogen or methyl; L is a linking group; and X is a Br, Cl, I, or a combination thereof. The linking group L can preferably be a divalent substituted or unsubstituted $C_{1-6}$ alkylene linking group. In a specific aspect, L can be an ethylene group.

The "*" in the foregoing Formula indicates a point of attachment to the rest of the polymer backbone.

In an aspect, the guanidinium halide-containing polymer can comprise repeating units according to Formula (VIII) and Formula (X), wherein each occurrence of $R^1$ is methyl, $R^6$ is a butyl group, and L is an ethylene group. For example, the guanidinium halide-containing polymer can comprise repeating units according to Formula (VIIIa) and (Xa)

(VIIIa)

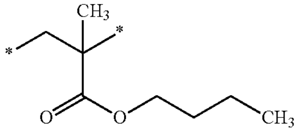

(Xa)

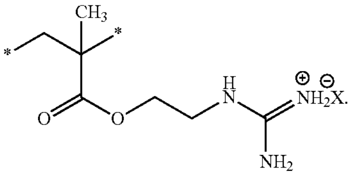

The repeating units according to Formula (X) can be present in any suitable amount provided that the copolymer is soluble in an aliphatic organic solvent. For example, the copolymer can have a solubility of up to 100 milligrams per milliliter in an organic solvent such as toluene or chloroform. In an aspect, the repeating units according to Formula (X) can be present in an amount of 1 to 10 mole percent. Within this range, the repeating units according to Formula (II) can be present in an amount of 1 to 8 mole percent, or 1 to 6 mole percent, or 1 to 5 mole percent, or 1 to 4 mole percent, or 1 to 3 mole percent.

The ammonium halide-containing copolymer or guanidinium halide-containing copolymer can have a number-average molecular weight ($M_n$) of 10,000 to 100,000 grams per mole (g/mol or Daltons, Da). Within this range, the Mn can be at least 15,000 g/mol, or at least 20,000 g/mol, or at least 30,000 g/mol, or at least 40,000 g/mol, or at least 50,000 g/mol. Also within this range, the Mn can be less than or equal to 90,000 g/mol, or less than or equal to 80,000 g/mol, or less than or equal to 70,000 g/mol, or less than or equal to 60,000 g/mol, or less than or equal to 50,000 g/mol. For example, in an aspect, the ammonium halide-containing copolymer or guanidinium halide-containing copolymer can have a number average molecular weight of 10,000 to 50,000 g/mol. In an aspect, the ammonium halide-containing copolymer or guanidinium halide-containing copolymer can have a number average molecular weight of 20,000 to 50,000 g/mol, or 30,000 to 50,000 g/mol, or 30,000 to 40,000 g/mol. In an aspect, the ammonium halide-containing copolymer or guanidinium halide-containing copolymer can have a dispersity (D) of greater than 1 to 2, for example 1.1 to 2.0, or 1.2 to 1.8, or 1.3 to 1.7. Molecular weight and dispersity of the ammonium halide-containing copolymer or guanidinium halide-containing copolymer can be determined, for example, using gel permeation chromatography (GPC) on a protected version of the polymer (e.g., wherein the amine groups are protected with a tert-butyloxycarbonyl (Boc) protecting group), for example eluting with tetrahydrofuran as the solvent and relative to poly(styrene) standards.

One or more ammonium halide-containing copolymers or guanidinium halide-containing copolymers can be used. In an aspect, the composition can comprise a single ammonium halide-containing copolymer or a single guanidinium halide-containing copolymer. In an aspect, the composition can comprise a combination of at least two ammonium halide-containing copolymers or at least two guanidinium halide-containing copolymers. For example, the composition can comprise a first ammonium halide-containing copolymer and a second ammonium halide-containing copolymer, wherein the second ammonium halide-containing copolymer is different from the first ammonium halide-containing copolymer. For example, the halide of the first and second ammonium halide-containing copolymers can be different. For example, the composition can comprise a first guanidinium halide-containing copolymer and a second guanidinium halide-containing copolymer, wherein the second guanidinium halide-containing copolymer is different from the first guanidinium halide-containing copolymer. For example, the halide of the first and second guanidinium halide-containing copolymers can be different. In an aspect, the composition can comprise at least one ammonium halide-containing polymer and at least one guanidinium halide-containing polymer. When present, the first and second ammonium halide-containing polymers or first and second guanidinium halide-containing copolymers can be present in a weight ratio of 1:9 to 9:1, or 2:8 to 8:2, or 3:7 to 7:3, or 4:6 to 6:4, or 4.5:5.5 to 5.5:4.5. In an aspect, the first and second ammonium halide-containing copolymers or first and second guanidinium halide-containing copolymers can be present in a weight ratio of 0.99:1 to 1.01:1. In a specific aspect, the first and second ammonium halide-containing polymers or first and second guanidinium halide-containing copolymers can be present in a weight ratio of 1:1.

The composition of the present disclosure is obtained by combining the perovskite nanocrystals and the ammonium halide-containing copolymer or guanidinium halide-containing copolymer. Accordingly, the composition can comprise the perovskite nanocrystals wherein at least a portion of which are bound, chelated, coordinated, or otherwise interactive with the ammonium halide-containing copolymer or guanidinium halide-containing copolymer. For example, the composition can comprise a halide exchange reaction product of the perovskite nanocrystals and the ammonium-halide containing copolymer or guanidinium halide-containing copolymer.

In an aspect, the ammonium halide-containing copolymer or guanidinium halide-containing copolymer can be present in the form of a coating on at least a portion of a surface of the perovskite nanocrystal.

The composition of the present disclosure can advantageously be provided in various forms. In an aspect, the composition can be in the form of a solution and thus further comprises a solvent, preferably an organic solvent. The organic solvent can be a non-halogenated, non-polar organic solvent, for example aliphatic hydrocarbons, aromatic hydrocarbons, or a mixture thereof. In an aspect, the organic solvent can be a halogenated organic solvent, for example halogenated aliphatic hydrocarbons, halogenated aromatic hydrocarbons, or a mixture there. Examples of suitable hydrocarbon solvents can include toluene, xylenes or aromatic hydrocarbons comprising from 1 to 5 $C_{1-6}$ alkyl substituents, and the like, or a combination thereof. Exemplary aliphatic hydrocarbon solvents can include hexane, cyclohexane, and the like, or a combination thereof. In an aspect, the organic solvent can comprise toluene or cyclohexane. When in the form of a solution, the composition can comprise 0.01 to 10 weight percent, or 0.01 to 5 weight percent, or 0.01 to 1 weight percent, or 0.05 to 0.1 weight percent of the perovskite nanocrystals. The composition (as a solution) can further comprise 0.5 to 50 weight percent, or 0.5 to 25 weight percent, or 0.5 to 10 weight percent, or 0.5 to 5 weight percent, or 1 to 5 weight percent of the ammonium-halide containing copolymer or guanidinium halide-containing copolymer. The solvent can be present in an amount of 40 to 99.5 weight percent, or 45 to 99.5 weight percent, or 50 to 99.5 weight percent, or 65 to 99.5 weight percent, or 70 to 99.5 weight percent, or 80 to 99.5 weight percent, or 90 to 99.5 weight percent, or 95 to 99.5 weight percent, or 94.9 to 98.95 weight percent. Weight percent of each of the foregoing components is based on the total weight of the composition, and totals 100 weight percent.

In an aspect, the composition of the present disclosure can be in the form of a film. The film can be a free-standing film or can be a substrate-supported film. In an aspect, the film can have a thickness of 5 to 1,000 micrometers, or 5 to 500 micrometers. Within this range, the thickness can be at least 10, 20, 30, or 40 micrometers. Also within this range, the thickness can be less than or equal to 400, 300, 250, 200, 100, or 75 micrometers. In an aspect, the film can have a thickness of 5 to 100 micrometers, or 20 to 80 micrometers, or 40 to 60 micrometers.

Films comprising the composition can be prepared by coating a solution (e.g., as described above) onto a substrate. Coating of the solution can generally be by any solution-coating method and can include, for example, solvent casting, spin coating, drop casting, ink jetting, doctor blading, dip coating, and the like. In an aspect, coating the solution can be by drop casting. The substrate can generally be of any material, for example glass, metal, or silicon. In an aspect, the substrate can further include a sacrificial layer positioned between the substrate and the composite layer to facilitate removal of the composite from the substrate. The method can further comprise removing the solvent from the coated layer on the substrate to provide the desired composition in film form. In an aspect, the method can further comprise removing the film from the substrate (e.g., to provide a free-standing film).

In an aspect, a polymer different from the ammonium halide-containing copolymer or guanidinium halide-containing copolymer can be present in the film, for example, as a host material. Exemplary host polymers can include, but are not limited to, poly($C_{1-6}$ alkyl) (meth)acrylate)s. In an aspect, a host polymer can comprise poly(n-butyl methacrylate).

In an aspect, the composition can be in the form of a powder. Powders can be obtained, for example, by providing the above-described solution and removing the solvent. Optionally the composition can be ground or otherwise processed to obtain the composition as a powder having a desired particle size. Alternatively, a suspension of the ammonium-halide containing polymer in a suitable solvent can be combined with the perovskite nanocrystals under conditions effective to promote adsorption of the nanocrystals to the polymer (e.g., with vigorous stirring).

The compositions of the present disclosure can advantageously be formulated so as to provide compositions having a particular photoluminescence profile. Stated another way, the compositions can provide a range of colored compositions, depending on the chemical identity of the perovskite nanocrystal and the ammonium halide-containing copolymer or the guanidinium halide-containing copolymer.

In an aspect, the composition can comprise a lead halide perovskite nanocrystal and a first ammonium halide-containing copolymer comprising repeating units according to Formula II, wherein X is Cl. In an aspect, the lead halide nanocrystal is a lead bromide nanocrystal of the formula $CsPbBr_3$. The composition can have a maximum emission at 440 to 445 nm. The composition can have a photoluminescence quantum yield of, for example, 40 to 50%.

In an aspect, the composition can comprise a lead halide perovskite nanocrystal, a first ammonium halide-containing copolymer comprising repeating units according to Formula II, wherein X is Cl, and a second ammonium halide-containing copolymer comprising repeating units according to Formula II, wherein X is Br. In an aspect, the lead halide nanocrystal is a lead bromide nanocrystal of the formula $CsPbBr_3$. Preferably, the first and second ammonium halide-containing copolymers are present in a weight ratio of 0.99:1 to 1.01:1, or 1:1. The composition can have a maximum emission at 480 to 485 nm. The composition can have a photoluminescence quantum yield of, for example, 65 to 75%.

In an aspect, the composition can comprise a lead halide perovskite nanocrystal and a first ammonium halide-containing copolymer comprising repeating units according to Formula II, wherein X is Br. In an aspect, the lead halide nanocrystal is a lead bromide nanocrystal of the formula $CsPbBr_3$, and the composition can have a maximum emission at 505 to 510 nm. The composition can have a photoluminescence quantum yield of, for example, 70 to 80%. In an aspect, the lead halide nanocrystal is a lead halide nanocrystal of the formula $CsPbBr_{1.5}I_{1.5}$ (i.e., a lead mixed halide nanocrystal).

In an aspect, the composition can comprise a lead halide perovskite nanocrystal, a first ammonium halide-containing copolymer comprising repeating units according to Formula II, wherein X is Br, and a second ammonium halide-containing copolymer comprising repeating units according to Formula II, wherein X is I. In an aspect, the lead halide nanocrystal is a lead bromide nanocrystal of the formula $CsPbBr_3$. Preferably, the first and second ammonium halide-containing copolymers are present in a weight ratio of 0.99:1 to 1.01:1, or 1:1. The composition can have a maximum emission at 560 to 570 nm. The composition can have a photoluminescence quantum yield of, for example, 80 to 90%.

In an aspect, the composition can comprise a lead halide perovskite nanocrystal, a first ammonium halide-containing copolymer comprising repeating units according to Formula II, wherein X is Br, and a second ammonium halide-containing copolymer comprising repeating units according to Formula II, wherein X is I. In an aspect, the lead halide nanocrystal is a lead mixed halide nanocrystal of the formula $CsPbBr_{1.5}I_{1.5}$. Preferably, the first and second ammonium halide-containing copolymers are present in a weight ratio of 0.99:1 to 1.01:1, or 1:1.

In an aspect, the composition can comprise a lead halide perovskite nanocrystal and a first ammonium halide-containing copolymer comprising repeating units according to Formula II, wherein X is I. In an aspect, the lead halide nanocrystal is a lead bromide nanocrystal of the formula $CsPbBr_3$, and the composition can have a maximum emission at 650 to 655 nm. The composition can have a photoluminescence quantum yield of, for example, 75 to 85%. In an aspect, the lead halide nanocrystal is a lead mixed halide nanocrystal of the formula $CsPbBr_{1.5}I_{1.5}$.

In an aspect, the composition can comprise a perovskite nanocrystal mixture (e.g., more than one type of perovskite nanocrystal), for example, a ternary perovskite nanocrystal mixture. The ternary perovskite nanocrystal mixture can include, for example, $CsPbBr_{1.5}Cl_{1.5}$, $CsPbBr_3$, and $CsPbBrI_2$. The mixture can comprise the three different perovskite nanocrystals in a weight ratio of, for example, greater than 0 to 1:greater than 0 to 1:greater than 0 to 1, for example, 1:1:1.

In an aspect, the composition can comprise the ternary perovskite nanocrystal mixture and an ammonium halide-containing copolymer comprising repeating units according to Formula II, wherein X is Br; or an ammonium halide-containing copolymer comprising repeating units according to Formula II, wherein X is Br, and a second ammonium halide-containing copolymer comprising repeating units according to Formula II, wherein X is Cl, preferably wherein the first and the second ammonium halide-containing copolymer are present in a 1:1 weight ratio; or a first ammonium halide-containing copolymer comprising repeating units according to Formula II, wherein X is Br, and a second ammonium halide-containing copolymer comprising repeating units according to Formula II, wherein X is I, preferably wherein the first and the second ammonium halide-containing copolymer are present in a 1:2 weight ratio.

In addition to the advantageous color tunability of the compositions described herein, the present inventors have also discovered that photoluminescence quantum yield of the perovskite nanocrystals can be increased in the presence of the ammonium halide-containing copolymer or guanidinium halide-containing copolymer compared to the perovskite nanocrystals in the absence of the polymer. For example, a solution comprising the composition of the present disclosure can exhibit an increase in photoluminescence quantum yield of at least 20% compared to the same perovskite nanocrystals not including the ammonium-halide containing copolymer.

In a further advantageous feature, the present inventors have discovered that aggregation of the ammonium halide-containing copolymer or guanidinium halide-containing copolymer can effectively arrest inter-nanocrystal halide exchange, thus providing stable compositions that exhibit the desired color. For example, the composition can comprise an aggregate comprising a perovskite nanocrystal surrounded by one or more polymer chains (e.g., as shown and described in the Figures of the present application). Aggregation can be induced by introducing a suitable non-solvent for the ammonium halide-containing copolymer or guanidinium halide-containing copolymer. In an aspect, solvent-induced aggregation can be accomplished by adding a nonpolar organic solvent, to the composition comprising the perovskite nanocrystals and the ammonium halide-containing copolymer or guanidinium halide-containing copolymer. In a specific aspect, solvent-induced aggregation can be accomplished by adding a nonpolar organic solvent such as cyclohexane to the composition comprising the perovskite nanocrystals and the ammonium halide-containing copolymer, preferably wherein the ammonium halide-containing copolymer has a styrene-based polymer backbone.

In an aspect, the composition can comprise a first aggregated composition comprising a first plurality of perovskite nanocrystals and a first ammonium halide-containing copolymer (or guanidinium halide-containing copolymer or copolymer mixture), and a second aggregated composition comprising a second plurality of perovskite nanocrystals and a second ammonium halide-containing copolymer (or guanidinium halide-containing copolymer). The first aggregated composition exhibits an emission maximum at a wavelength different from an emission maximum of the second aggregated composition. Stated another way, when taken separately, the first aggregated composition and the second aggregated composition exhibit different color emissions. Without wishing to be bound by theory, it is envisaged that when mixed together to provide the composition, the presence of the polymer aggregates minimizes or eliminates inter-aggregate halide exchange (i.e., between the first and second aggregated compositions). Accordingly, the composition comprising the first and second aggregated compositions exhibits two emission maxima, corresponding to the emission maximum of each of the first and second aggregated compositions. Similarly, a composition comprising a first, second, and third aggregated composition can exhibit three emission maxima, corresponding to the emission maximum of each of the first, second, and third aggregated compositions.

In an aspect, a film can be prepared from the composition comprising the aggregated polymer, optionally in the presence of a second polymer (e.g., poly(butyl methacrylate)). Advantageously, the film can exhibit color purity retention for at least one week.

In an aspect, the composition of the present disclosure can be prepared by combining a plurality of perovskite nanocrystals and the ammonium halide-containing copolymer or guanidinium halide-containing copolymer under conditions effective to provide the composition. For example, the combining can be in the presence of a solvent, preferably an organic solvent to provide a solution. A film can be formed, for example by any suitable film forming methods, e.g., by solution casting of the aforementioned solution. Prior to contacting with the ammonium halide-containing copolymer or guanidinium halide-containing copolymer, the perovskite nanocrystal can be prepared by a method comprising, for example, injecting a Cs precursor (e.g., Cs oleate) can be injected to a solution comprising a lead halide precursor (e.g., $PbX_2$, wherein X is Cl, Br, I, or a combination thereof), ligand precursors (e.g., oleic acid, oleylamine, or a combination thereof) under conditions effective to provide the composition (e.g., at a temperature of 140 to 200° C.). Alternatively, the perovskite nanocrystal can be synthesized by a method comprising injection of a halide precursor (e.g., benzoyl bromide) into a solution comprising lead precursor (e.g. $Pb(OAc)_2 \cdot 3\ H_2O$), cesium precursor (e.g., $Cs_2CO_3$), and ligand precursors (e.g., oleic acid and didodecylamine) under conditions effective to provide the composition (e.g., at a temperature of 80 to 140° C.). The composition can be precipitated and washed.

In an aspect, the composition of the present disclosure may be prepared by a so-called "direct synthesis" method, wherein the perovskite nanocrystals are prepared in the presence of the ammonium-containing polymer (e.g., as the ligand), and the composition may therefore be obtained without any ligand exchange steps. For example, Cs precursor (e.g., Cs oleate) may be injected to a solution comprising a lead halide precursor (e.g., $PbX_2$, wherein X is Cl, Br, I, or a combination thereof), and the ammonium-containing polymer under conditions effective to provide the composition (e.g., at a temperature of 140 to 200° C.). The composition can be precipitated and washed.

Exemplary methods for the manufacture of the composition are further described in the working examples below.

The compositions described herein can be particularly useful in various light emitting devices. In an aspect, the composition can be used in a semiconductor device such as an electroluminescent device, a photoluminescence device, a solar cell, a display device, a sensor device, a piezoelectric device, or a nonlinear optical device. In an aspect, the composition can be useful in a light emitting diodes.

In an aspect, a device can comprise a first electrode, a second electrode, and a light emitting layer between the first electrode and the second electrode, wherein the light emitting layer comprises the composition of the present disclosure. The light emitting device can further include a substrate. In an aspect, at least one of the first electrode, the second electrode, or the substrate can be transparent. As used herein, "transparent" means that the material has a visible light transmission of greater than 60 to 100%, preferably greater than 90 to 100%, for example over the range of 400 to 800 nanometers.

The substrate, when present, can preferably comprise glass or a polymer substrate. The glass can be all possible types of glass, such as, for example, typical window glass. However, preference is given to the use of flat glasses, as used in the display industry (for example soda-lime glass or alkali-free glass). Exemplary polymeric substrate materials can include a thermoplastic polymer, for example polycarbonate (PC), polymethyl methacrylate (PMMA), polyvinylcarbazole (PVK), polybutadienes, polyethylene (PE), polyethylene terephthalate (PET), polyester, and the like, or a combination thereof. In an aspect, the substrate can comprise a metallic substrate, for example, metallic foils. In an aspect, the substrate can have a thickness of, for example, 0.05 to 3 mm, or 0.2 to 1.1 mm.

The first and second electrode can be selected such that their potential substantially matches the potential of the adjacent light emitting layer to provide efficient electron or hole injection.

For example, the first electrode can be a positive electrode, and can comprise, for example, a metallic material (e.g., Al, Ag, Au, Cr, and the like, or a combination thereof). The metallic material can preferably have a low work function, be a metal alloy or a multilayered structure with various metals, such as, for example, alkaline earth metals, alkali metals, main-group metals or lanthanides (e.g., Ca, Ba, Mg, Al, In, Mg, Yb, Sm, and the like, or a combination thereof). In an aspect, a multilayered structure can be used, and the positive electrode can optionally further comprise a high work function metal (e.g., Ag, Ca/Ag or Ba/Ag, and the like, or a combination thereof). In an aspect, a transparent positive electrode can be used, and can comprise, for example, indium tin oxide (ITO).

A positive electrode can have a thickness of, for example, 10 to 10,000 nanometers, or 20 to 1,000 nanometers.

In an aspect, the second electrode can be a negative electrode, and can comprise, for example, a conductive mixed metal oxide, preferably indium tin oxide (ITO), indium zinc oxide (IZO), aluminium zinc oxide (ALZO), and the like, or a combination thereof. Doped versions of the foregoing oxides are also contemplated (e.g., fluorine-doped ITO). Other negative electrode materials can include, for example, Ag, Pt or Au.

A negative electrode can have a thickness of, for example, 10 to 10,000 nanometers, or 20 to 1,000 nanometers.

The light emitting layer comprises the composition of the present disclosure, preferably in the form of a film. The light emitting layer can have a thickness of, for example, 10 to 300 nm, or 20 to 150 nm, or 30 to 100 nm, or 40 to 80 nm.

This disclosure is further illustrated by the following examples, which are non-limiting.

Examples

The synthesis of ammonium halide-functionalized polystyrene was accomplished by radical copolymerization of styrene with 4-([N-boc]aminomethyl)styrene (1), as shown in FIG. 1, followed by boc-deprotection to yield the free amine Emulsion polymerization conditions proved most useful for synthesizing these copolymers on a 5-10 gram scale in 50-90% yields; these conditions allowed polymerizations to proceed in shorter times and at higher yields than attempted polymerizations in homogenous solution. In a typical experiment, a solution of monomer (1) in styrene was emulsified in water, with sodium dodecyl sulfate (SDS) as surfactant and potassium persulfate (KPS) as free radical initiator present in the aqueous phase, and dodecanethiol as a chain-transfer agent present in the organic phase. Boc-protection of the amines proved essential, since employing 4-vinylbenzylamine directly in the free radical polymerization led to slow reactions due to extensive chain-transfer. The polymers shown in FIG. 1 are denoted by the monomer feed used in their preparation: PS—NBoc-1%, PS—NBoc-2%, and PS—NBoc-5% were isolated as solids and characterized by gel permeation chromatography (GPC) to have number-average molecular weight ($M_n$) values ranging from 41 to 84 kDa and molecular weight distributions (Đ) of 2.1-2.4. The boc-groups were removed by stirring the polymer products in solution with sources of HCl, HBr or HI. For example, combining a $CH_2Cl_2$ solution of PS—NBoc with concentrated HBr or HI led to complete deprotection in less than 24 hours, with subsequent precipitation into methanol or isopropanol affording the corresponding polycations PS—$NH_3Br$ and PS—$NH_3I$. Similarly, stirring a 1,4-dioxane solution of PS—NBoc in 4M $HCl_{(aq)}$ yielded PS—$NH_3Cl$. The ammonium halide-containing products were isolated in good yield (77-92%) and high purity as white or off-white powders. 1H NMR spectroscopy confirmed complete boc-deprotection, with the ammonium proton resonances found at δ=7.9 (PS—$N\underline{H}_3I$), 8.3 (PS—$N\underline{H}_3Br$), and 8.6 ppm (PS—$N\underline{H}_3C_1$). The percent halide content of these polymers measured by elemental analysis was consistent with the polymer composition estimated by 1H NMR, except for PS—$NH_3I$, which contained less iodide (1.5% w/w) than predicted (2.5% w/w). Based on these observations, the precipitation step appears to be effective in removing residual acid from these polymers, with control experiments confirming the presence of $HBr_{(aq)}$ leads to very large reduction in PLQY. The ability to isolate/purify these polymers by a single, high-yielding precipitation step is a practical advantage over small molecule halide sources—especially for PS—$NH_3I$, since oleylammonium iodide forms a waxy semisolid that is difficult to purify and isolate. Moreover, many halide sources such as $PbX_2$ and n-octadecylammonium halide salts struggle to dissolve in toluene, leading to inefficient exchange with $CsPbX_3$ PNCs; in contrast, the PS—$NH_3X$ polymers are soluble in many useful organic solvents, including chloroform and toluene, at concentrations up to 100 mg/mL, a convenient and effective procedure for performing experiments in conjunction with perovskite PNCs.

Figure 2:
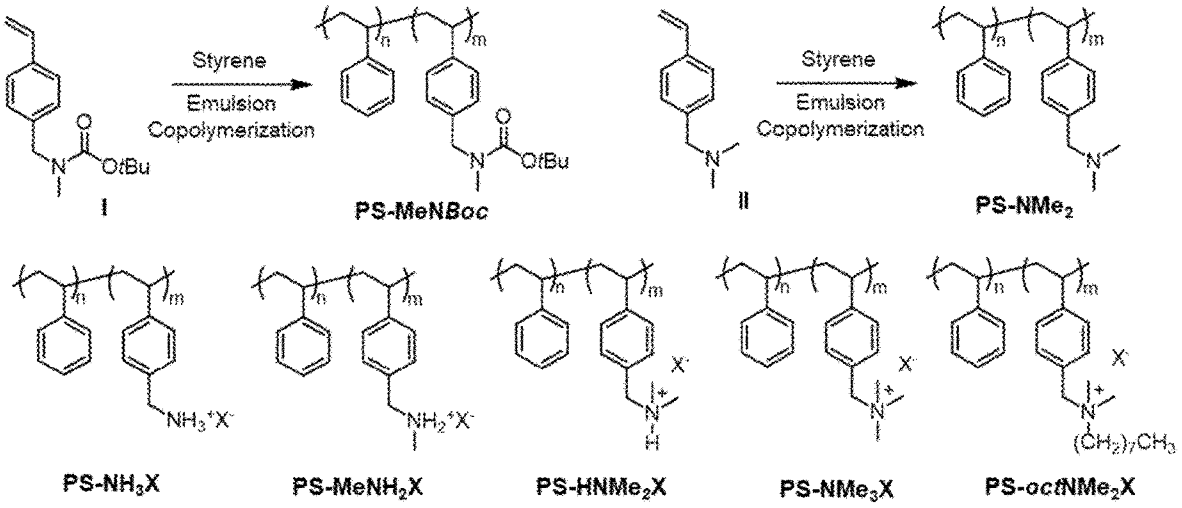
FIG. 2 shows the synthesis of ammonium halide-functionalized polystyrene by emulsion copolymerization and subsequent Boc-deprotection in acidic solution according to an aspect of the present disclosure.

A series of methyl-substituted ammonium halide copolymers were prepared, as shown in FIG. 2. The monomer NN-dimethyl-4-vinylbenzylamine (shown as compound I) was copolymerized with styrene under emulsion conditions using sodium dodecyl sulfate as surfactant, n-dodecanethiol as chain transfer agent, and potassium persulfate as initiator. The resulting copolymer (PS—$NMe_2$) was isolated in ~66% yield (typical $M_n$ ranging from 123-220 kDa and polydispersity index (PDI) from 2.8-3.1). The dimethylamino side chain incorporation ranged from 1.7-4.5 mol %, depending on feed composition. A second monomer, N-methyl-N-Boc-4-vinylbenzylamine (shown as compound II), was also copolymerized with styrene under the same emulsion conditions, leading to ~67% isolated yields of the desired copolymer (PS-MeNBoc, =53-124 kDa; PDI=2.8-4.2) with 2.3-5.5 mol % incorporation of Boc-protected methylamino side chains.

After isolating the PS—$NMe_2$ and PS-MeNBoc copolymers, their side chain functional groups were modified to yield cationic ammonium halide salts. Polymers containing secondary N-methylammonium halide salts (PS-$MeNH_2X$, X=Br, I) were prepared by Boc-deprotection of PS-MeN-Boc, by stirring a solution of the polymer in $CH_2Cl_2$ with concentrated acid $HBr_{(aq)}$ or $HI_{(aq)}$, followed by precipitation into isopropanol. Polymers containing tertiary N,N-dimethylammonium halide salts in the side chain (PS—$HNMe_2X$, X=Br, I) was synthesized by protonating a solution of PS—$NMe_2$ polymer in $CH_2Cl_2$ with concentrated acid $HBr_{(aq)}$ or $HI_{(aq)}$, followed by precipitation into isopropanol. The synthesis of polymers containing quaternary N,N,N-trimethylammonium halide salts (PS—$NMe_3X$, X=Br, I) or N-octyl-N,N-dimethylammonium halide salts in the side chain (PS-oct$NMe_2X$, X=Br, I) was accomplished by reacting PS—$NMe_2$ with $CH_3Br$ or $CH_3I$, or by heating PS—$NMe_2$ as a solution in dimethylformamide with n-octyl bromide or n-octyl iodide, respectively. Isolation of the quaternary ammonium polymers was performed by precipitation into MeOH; if this failed to produce precipitate, then the polymer was purified by dialysis against MeOH and water using a regenerated cellulose membrane, followed by lyophilization.

The PNCs used in the present examples were synthesized by 'hot injection' methods, which involve injection of Cs-oleate to a solution of $PbX_2$ salts (X=Cl, Br or I), oleic acid, and oleylamine in 1-octadecene at 140-200° C., followed by precipitation and washing of the NC product. This general procedure was used to prepare $CsPbBr_3$ perovskite NCs, as well as mixed halide compositions, including for example the blue-emitting $CsPbBr_{1.5}Cl_{1.5}$ ($\lambda_{max}$ 451 nm; FWHM 17 nm), orange-emitting $CsPbBr_{1.5}I_{1.5}$ ($\lambda_{max}$ 585 nm; FWHM 35 nm), and red-emitting $CsPbBrI_2$ ($\lambda_{max}$ 635 nm; FWHM 32 nm). For these mixed halide compositions, the NCs are referred to herein by the stoichiometry of the $PbX_2$ salts used in their syntheses. The crude PNC reaction mixtures were centrifuged and washed with methyl acetate (MeOAc), then characterized by transmission electron microscopy (TEM), UV-vis and photoluminescence (PL) spectroscopy, and powder x-ray diffraction (XRD). The green $CsPbBr_3$ NCs exhibited narrow PL emission at 507 nm (FWHM 19 nm) and an approximately cubic morphology with an average edge length (davg) of 9±1 nm revealed by TEM. The concentration of NCs after washing, assessed by UV-vis absorbance to be about 0.8 μM, gives an overall isolated yield of 28%. The PL quantum yield (PLQY) of the $CsPbBr_3$ PNCs after washing was found to be 51% vs. a fluorescein standard.

Color tuning experiments with perovskite nanocrystals were performed using PS—$NH_3X$, PS-$MeNH_2X$, PS—$HNMe_2X$, PS-oct$NMe_2X$, and PS—$NMe_3X$ series of polymers. For the PS—$NH_3X$ series, the polymer was used as a concentrated solution (100 mg/mL) in toluene, and the $CsPbBr_3$ nanocrystals (NCs) prepared using typical hot-injection methods. For PS-$MeNH_2I$, PS—$HNMe_2I$, PS-oct$NMe_2I$ and PS—$NMe_3I$, color tuning was best done using alternative NC synthesis methods to prepare $CsPbBr_3$ NCs with a cesium oleate ligand shell, and using dilute polymer solutions (10 mg/mL) in chloroform. Starting from a $CsPbBr_3$ NC emitting in the range of 508-511 nm, bright red emission was achieved by mixing with PS-$MeNH_2I$ (661 nm) and PS—$HNMe_2I$ (641 nm). Further increasing the alkyl substitution at nitrogen decreases the iodide-donating ability of the polymer, with PS-oct$NMe_2I$ giving orange fluorescence (583 nm) and PS—$NMe_3I$ giving yellow fluorescence (547 nm).

Figure 3:
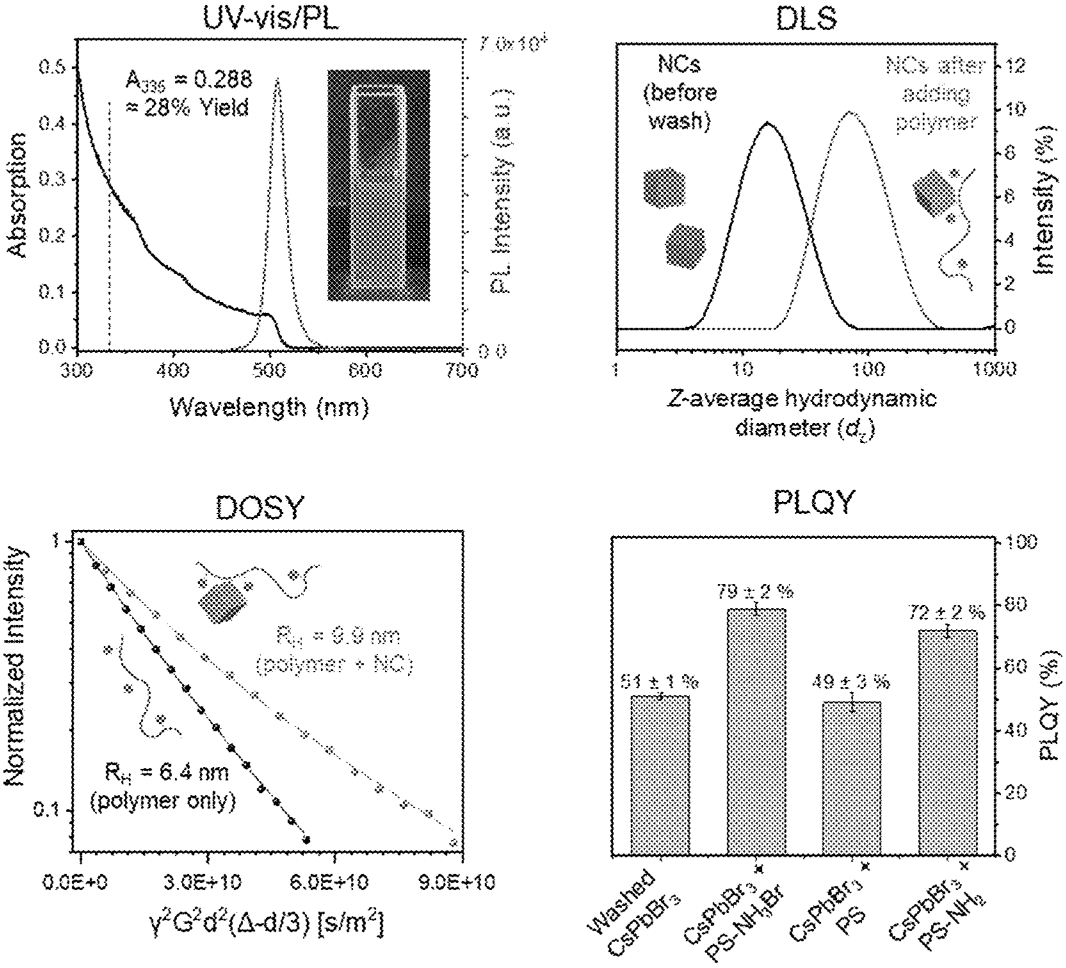
FIG. 3 shows characterization of $CsPbBr_3$ NCs before and after addition of PS—$NH_3$Br-2%. Top Left: Overlay of UV-vis and PL ($\lambda_{ex}$=450 nm) spectra for NCs after washing with MeOAc (no added polymer); Bottom Right: Comparison of PL quantum yields of washed NCs before and after addition of PS—$NH_3$Br, PS, and PS—$NH_2$; Bottom Left: DOSY NMR attenuation plots for PS-Bz$NH_3$Br polymer in benzene with and without $CsPbBr_3$ NCs; Top Right: DLS intensity plots showing an increase in hydrodynamic size of the NCs after adding polymer.

In particular, for the PS—$NH_3X$ series of polymers, mixing equal volumes of the MeOAc-washed $CsPbBr_3$ (1.3 mg/mL in toluene) and PS—$NH_3Br$ (100 mg/mL in toluene, corresponding to about 1500 chains, or about $2.5\times10^4$ ammonium halide, per NC) led to a substantial increase in PLQY, reaching nearly 80%. This recovery in PLQY is attributed to replenishing of halide and repair of defect-induced trap states resulting from halide-deficient Pb sites that are known to lower PLQY. TEM images of the NCs after this polymer treatment revealed no substantive changes in NC size ($d_z$=9±1) and UV-Vis showed no change in absorption intensity (i.e., NC concentration). Additional experiments, detailed in FIG. 3, confirmed the role of halide in PLQY enhancement as well as the impact of other components. For example, simply mixing $CsPbBr_3$ NCs with a polystyrene sample containing no pendent ammonium groups (prepared by emulsion polymerization with $M_n$=192 kDa and Đ=4.35) gave either no change or a modest increase in PLQY, depending on the methods used to prepare the polymer (i.e., choice of chain transfer agent, 1-dodecanthiol or $CCl_4$, with small PLQY increases in the case of the former possibly due to chain-end effects emanating from the thioether terminal group inherent to chain transfer with thiol). When the NCs were treated similarly with PS—$NH_2$ copolymers (i.e., containing pendent benzyl amines by neutralizing PS—$NH_3Br$), a pronounced PLQY enhancement was observed, reaching 72±2%, possibly due to the interaction of free amine with undercoordinated lead at the NC surface.

Replacing the oleylammonium ligands on the as-synthesized PNCs with PS—$NH_3Br$ polymer fundamentally alters the solution dispersion of PNCs. Whereas n-hexane is a useful dispersant for oleyl-capped $CsPbBr_3$ perovskite NCs, the polymer-functionalized NCs precipitate from solution, consistent with other studies using poly(styrene)-based NC ligands. Evidence in support of polymer-PNC interactions was derived from diffusion-ordered nuclear magnetic resonance spectroscopy (DOSY) experiments and dynamic light scattering (DLS) measurements. DOSY, performed on both polymer-PNC solutions in $C_6D_6$, as well as free polymer solutions containing no NCs, produced the attenuation curves plotted in FIG. 2. The fitting quality seen when modeling the raw data using the Stejskal-Tanner equation suggests non-Gaussian diffusion behavior, potentially induced by the high dispersity value (Đ=2.35) of the PS-Bz$NH_3Br$ sample; to correct for this, a model based on the log-normal chain distribution was developed to simulate a population of polymer chains of varying length. The diffusion coefficient for each molecular weight fraction was estimated using known scaling laws for the translational diffusion coefficient D of polystyrene chains in a good solvent (i.e., benzene), which matched well with the experimental data. The hydrodynamic radii obtained from the model show a clear increase when going from the free polymer (6.4 nm) to the polymer-PNC mixture (10 nm), indicative of polymer-PNC surface interactions. In addition, DLS was used to measure the Z-average hydrodynamic diameter of $CsPbBr_3$ PNCs before washing and ligand exchange ($d_z$=16.27±0.04 nm) and after mixing with PS-Bz$NH_3Br$ ($d_z$=64.0±0.4 nm)—again, the clear increase in hydrodynamic size is taken as evidence for polymer association with the NC surface. While polymer-PNC binding equilibria cannot be derived from this data alone, the potential for multidentate interactions between PS—$NH_3Br$ (~15 ammonium bromides per chain) and the NC surface may overcome the inherently weak NC binding of alkylammonium ligands.

Figure 4:
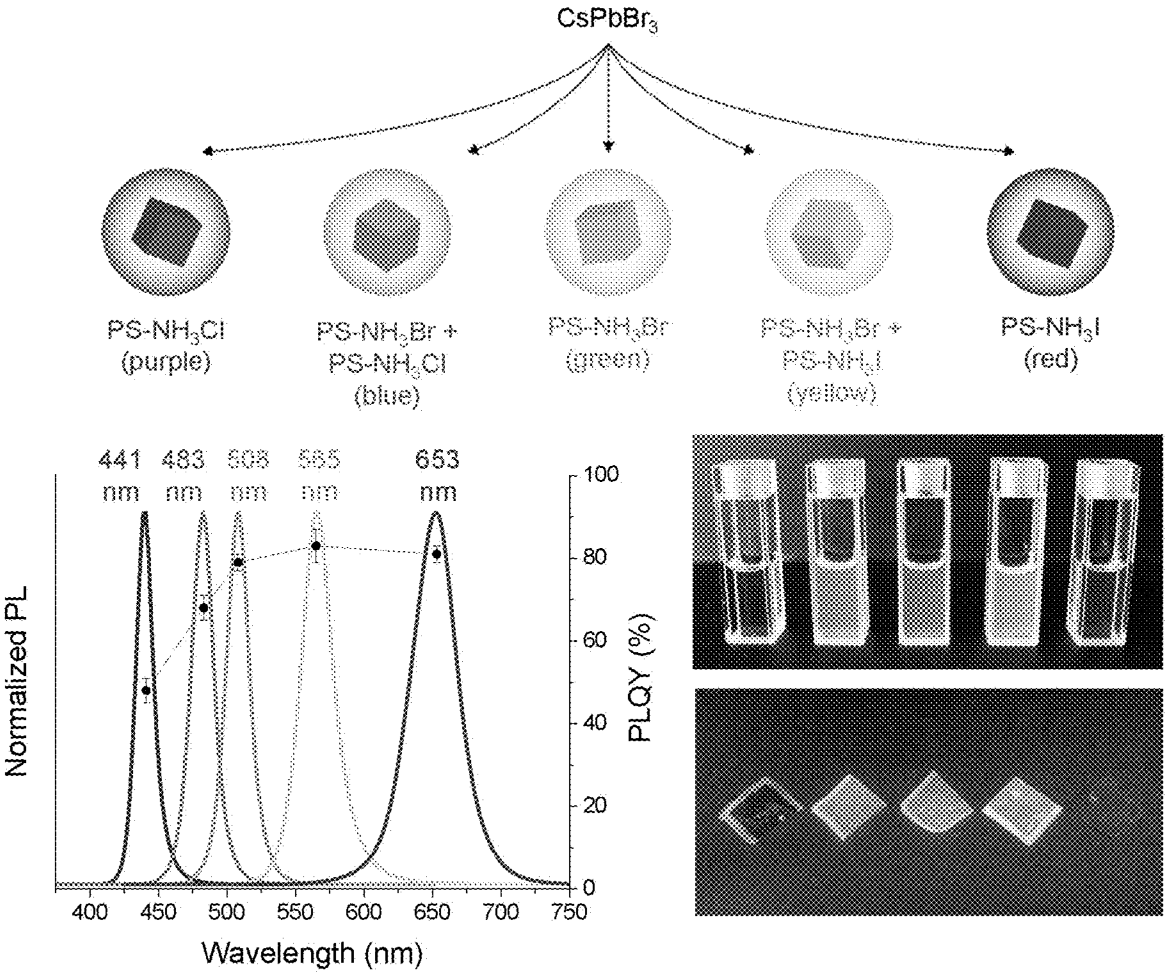
FIG. 4 shows the shift in PL emission of $CsPbBr_3$ NCs following addition of combinations of PS—$NH_3$Br, PS—$NH_3$I, and PS—$NH_3$Cl. The PL spectra and QY values listed represent dilute polymer/PNC solutions in toluene. Photographs of PS—$NH_3$X+$CsPbBr_3$ solutions and films were taken upon 365 nm UV irradiation (color of the solutions and corresponding films from left to right: purple, blue, green, yellow, red).

Having established polymer-PNC interactions and the associated boost of QY, mixed halide systems were examined, in which PS—$NH_3Cl$ or PS—$NH_3I$ were combined with $CsPbBr_3$ NCs. Under similar solution conditions as outlined above, polymer-NC mixtures were diluted for analysis of their optical properties, then cast as thin films on quartz. This mixing in solution and the solid state caused in a major shift in PL emission maximum—from 507 nm in the original PNCs to 441 and 653 nm, respectively, for the chloride and iodide cases—and produced vibrant purple and red solutions and nanocomposite films, as shown in FIG. 4. This color tuning is attributed to halide exchange between the NCs and the ammonium halide pendent groups on PS. The polymer-NC composite materials were adjustable between purple and red employing blends of ammonium halides, i.e., PS—$NH_3Br/Cl$ or PS—$NH_3Br/I$, as illustrated in FIG. 4 for a 1:1 (w/w) mixtures of the polymers in combination with $CsPbBr_3$ NCs to produce either blue ($\lambda_{em.\ max}$=483 nm) or yellow ($\lambda_{em.max}$=565 nm) emitting nanocomposites. Overall, this polymer-based halide exchange method results in a broad spectral palette with excellent color purity in solution (FWHM=15 [purple], 19 [blue], 20 [green], 27.5 [yellow] and 39 nm [red]) that is comparable to results obtained by the direct synthesis of mixed-halide NCs or via halide exchange using small molecule halide sources. This approach is particularly advantageous for casting optically transparent, mechanically robust films directly from the exchange mixture, while giving structures that retain their narrow PL emission profile upon drying. Interestingly, a modest color drift was observed in going from solution to the nanocomposite films, especially for the PS—$NH_3I$ case which yielded a red shift of 12 nm from 653 to 665 nm. Without wishing to be bound by theory, it is believed that this is due to continuation of anion exchange during drop-casting and drying. Starting from MeOAc-washed $CsPbBr_3$ PNCs (QY=51±1%), we obtained QY values of 48±3, 68±3, 83±4 and 81±2% for the purple, blue, yellow, and red solutions resulting from halide exchange.

To augment the preparation of nanocomposite solutions and films, polymer-PNC nanocomposites were also isolated as free-flowing powders under heterogeneous conditions by suspending PS—$NH_3X$ in an n-hexane solution of $CsPbBr_3$ NCs and stirring vigorously as the PNCs adsorbed to the polymer. This is additionally advantageous as it precludes the need to use polar solvents in PNC workup (washing) procedures. Color-tuning using PS—$NH_3X$ is general, and the same breadth of the visible spectrum is accessible compared to starting from other synthesized $CsPbX_3$ compositions. For example, free standing polymer-PNC films were prepared by combining orange $CsPbBr_{1.5}I_{1.5}$ NCs with PS—$NH_3Br$, 1:1 PS—$NH_3Br$/PS—$NH_3I$, or PS—$NH_3I$, giving green, red, or orange-emitting nanocomposites that retain bright PL even after submerging the films in water for six months.

The ease with which $CsPbX_3$ PNCs undergo post-synthesis anion exchange and bandgap tuning represents a distinguishing feature of these NCs from metal chalcogenide QDs. However, such rapid exchange kinetics make it challenging to fix a precise, pre-determined halide composition (i.e., color), especially when mixing NCs of different composition. Rapid, inter-NC halide metathesis converges on a single $CsPbX_3$ composition emission spectrum very shortly after mixing, preventing coexistence of differently emitting NCs that are of interest for white light LEDs.

Figure 5:
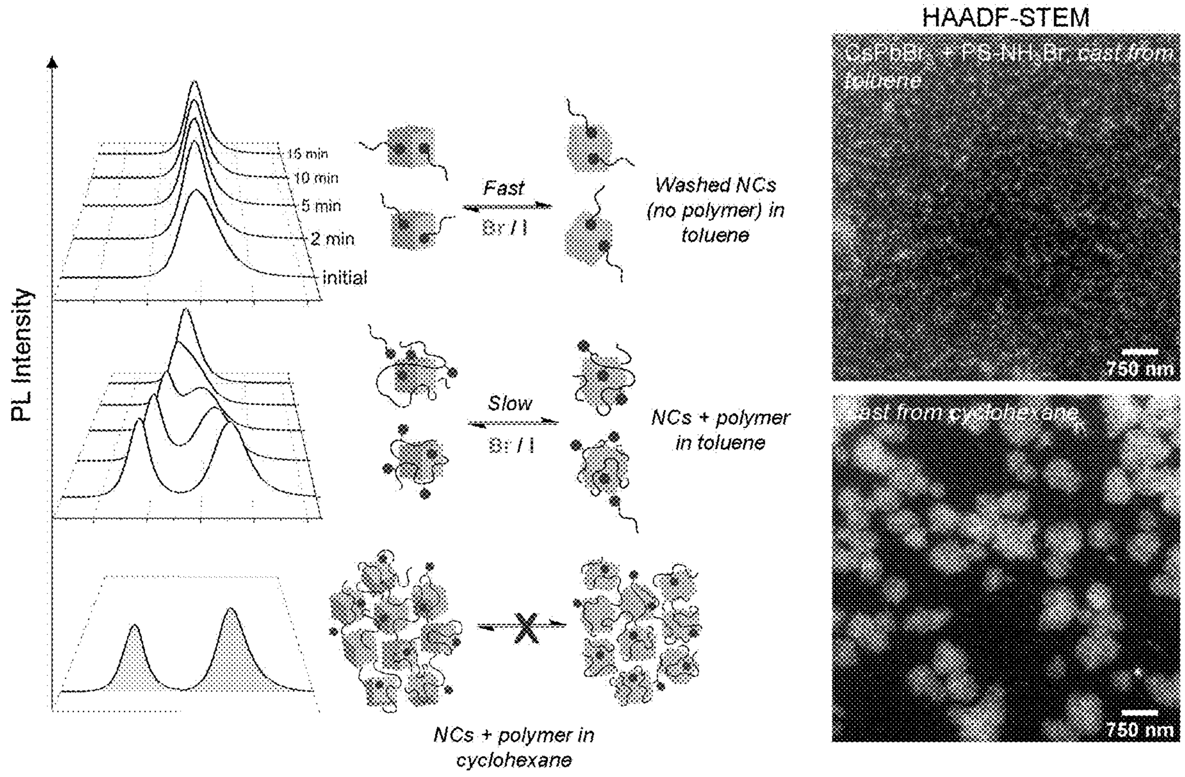
FIG. 5 shows time-evolved PL emission spectra obtained after mixing previously prepared green $CsPbBr_3$ and orange $CsPbBr_{1.5}I_{1.5}$ PNCs with small molecule ligands (top), with polymer ligands in toluene (middle) and polymer ligands in cyclohexane (bottom). Shown on the right is a comparison of STEM-HAADF images of $CsPbBr_3$ PNCs with PS—$NH_3$Br ligand cast from toluene versus cyclohexane (top left).

Judging that halide exchange is a surface-mediated process, it was reasoned that polymeric ligands can influence inter-NC metathesis kinetics. We tested this by tracking the time-evolved PL spectra of $CsPbBr_3$ and $CsPbBr_{1.5}I_{1.5}$ NCs after mixing in toluene (FIG. 5). For the washed NCs without polymer, rapid exchange (within seconds) produced a single NC composition with PL emission intermediate between its two parents. Thus, introducing polymers to the NCs significantly slowed exchange kinetics, requiring up to 15 minutes to form a single, uniform emission profile. While this result already displays the power of macromolecular exchange to control the kinetics of color tuning, it was further found that the timescale may be modulated to produce multi-color emissive films.

Figure 6:
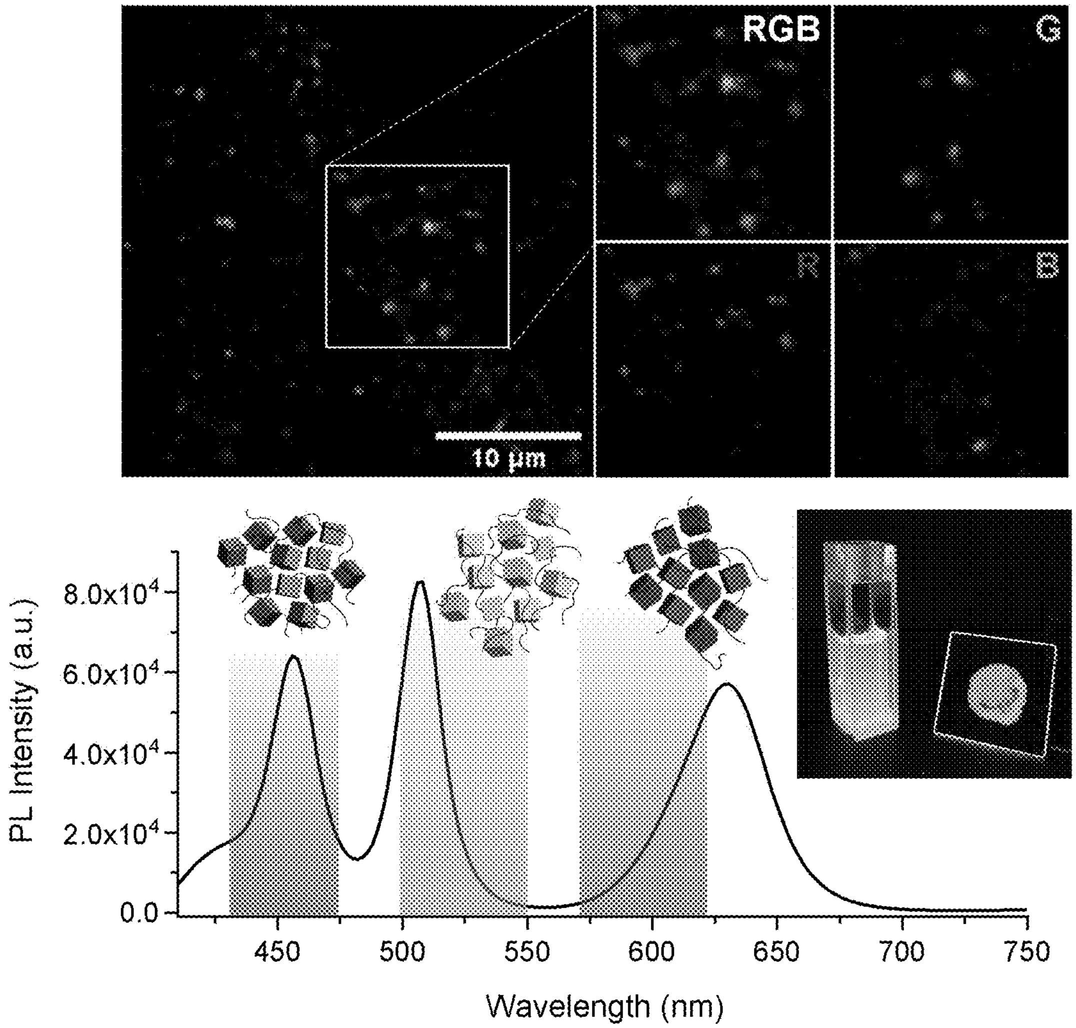
FIG. 6 (top) shows laser scanning confocal microscopy images of polymer nanocomposites cast from cyclohexane with green, blue, and red-emitting PNCs. The bottom shows the result of mixing green-, blue- and red-emitting PNCs with polymer ligands to produce white light-emitting solutions; the film shown was prepared by co-casting with poly(n-butyl methacrylate).

Solvent-induced aggregation of the polymer-NC conjugates offers another route to tune exchange kinetics, and the formation of dense interchain aggregates (such as for dilute polystyrene in cyclohexane below the theta temperature) could reduce halide ion mobility. Diluting the PS—$NH_3X$/PNC solutions into cyclohexane forms a turbid solution, and the hydrodynamic size measured by DLS jumps from $d_z$=64.0±0.4 nm using toluene as dispersant to $d_z$=552±7 nm using cyclohexane, strongly suggesting the presence of large polymer-NC aggregates (FIG. 6). This is corroborated by STEM analysis of samples cast from cyclohexane, which revealed dense clusters of NCs, greater than 100 nm in diameter. Remarkably, mixing cyclohexane solutions of PS—$NH_3X$-ligated $CsPbBr_3$ and $CsPbBr_{1.5}I_{1.5}$ NCs completely arrested halide exchange, even after 30 min to 2 hrs, and produced samples with distinct, co-existing NC populations (FIG. 5). Impressively, fourteen hours after mixing, two PL emission peaks were observed, a finding that suggests a path towards simple, solution-processing of all-perovskite multicolor composites by solution processing. To demonstrate, binary blue-green ($CsPbBr_{1.5}Cl_{1.5}$+$CsPbBr_3$) and ternary blue-green-red mixtures ($CsPbBr_{1.5}Cl_{1.5}$ $CsPbBr_3$+$CsPbBrI_2$) of PNCs and polymers were explored, the latter useful for the preparation of white-emissive solutions and films. To test whether the $CsPbX_3$ PNCs are confined within polymer aggregates, and thereby unable to migrate or participate in inter-NC halide exchange, cyclohexane solutions of $CsPbBr_{1.5}Cl_{1.5}$ and $CsPbBr_3$ PNCs were mixed with PS—$NH_3X$ ligands and analyzed their elemental composition by STEM-EDS. EDS line scans confirmed that Cl is only present in some of the polymer-PNC bundles (whereas Br is present in all of them), and the EDS spectra of these Cl-containing PNC clusters confirms a 1:1 Br/Cl stoichiometry. Three-component mixtures of polymer+ $CsPbBr_3$, $CsPbBr_{1.5}Cl_{1.5}$ and $CsPbBrI_2$ PNCs were also prepared using cyclohexane as the dispersant, adjusting the ratios of each PNC-polymer 'ink' until bright white emission was observed. Much like the binary green-orange system used to study exchange kinetics, the PL emission spectrum of the white-emitting solutions contains discrete peaks each of the three emitting components up to 12 hours after mixing. Directly casting this solution onto a quartz slide provides only weak fluorescence on drying; however, this was addressed by co-casting the PNC+PS—$NH_3X$ mixture with a second, cyclohexane-soluble polymer, such as poly (n-butyl methacrylate) (PBMA), which afforded white light emitting films that retained their color purity even after standing for one week (FIG. 6).

Figure 7:
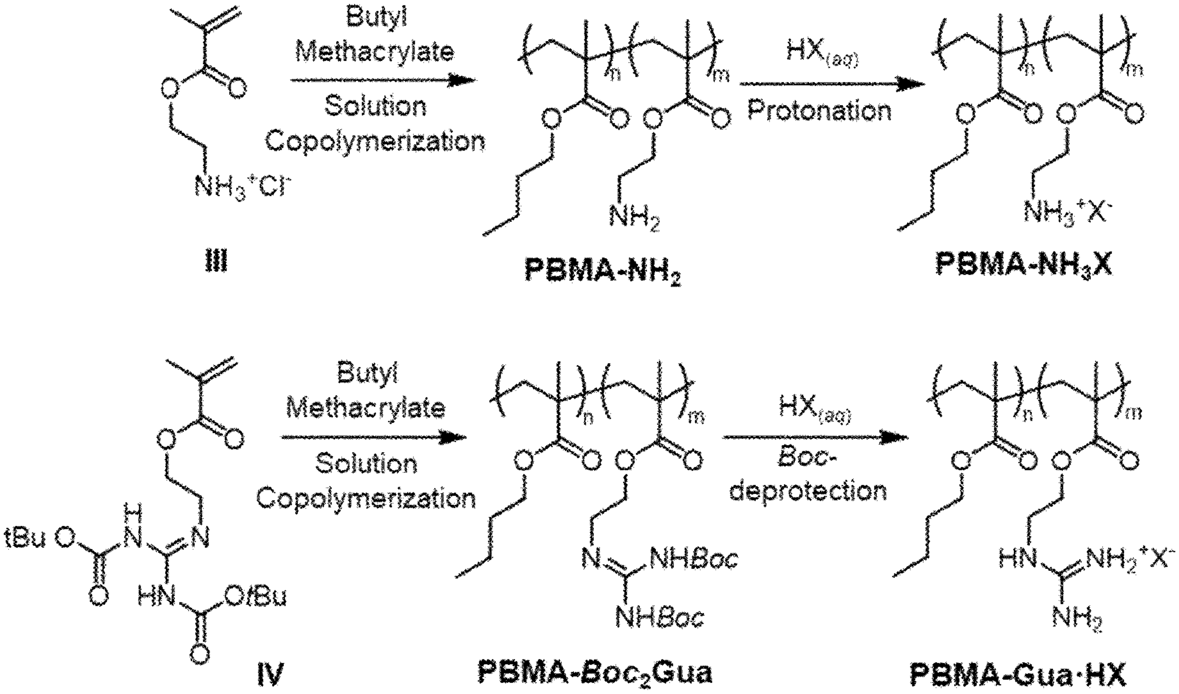
FIG. 7 shows the synthesis of ammonium halide-functionalized polymethacrylate and guanidinium halide-functionalized polymethacrylate by solution copolymerization and subsequent protonation or Boc-deprotection in acidic solution according to an aspect of the present disclosure.

Additional polymers employing non-styrenic polymer backbones were also prepared, as shown in FIG. 7, such as by solution polymerization of n-butyl methacrylate with 2-aminoethylmethacrylate hydrochloride (shown as compound III), using 2,2,2-trifluoroethanol (TFE) as solvent, azobisisobutyronitrile (AIBN) as initiator, and a small amount of 4 M HCl in dioxane to acidify the polymerization mixture and protonate the amine. Precipitation in a 1:100 (v/v) solution of triethylamine in MeOH yielded the deprotonated copolymer (PBMA-$NH_2$, 60% yield, $M_n$=52 kDa, Đ=2.0) containing 4.0 mol % aminoethyl sidechains. Reprotonation of the side chains was accomplished by stirring a $CH_2Cl_2$ solution of polymer with concentrated acid $HBr_{(aq)}$ or $HI_{(aq)}$, followed by precipitation into a mixture of 20% v/v 1 M $HX_{(aq)}$ (X=Br or I) in MeOH.

Other nitrogen-based cations were investigated, such as a Boc-protected guanidine-containing methacrylate (shown as compound IV), which was copolymerized with n-butyl methacrylate in trifluoroethanol (TFE) using AIBN as initiator to give a copolymer (PBMA-Boc2Gua, 73% yield, $M_n$=47.9 kDa, PDI=2.1) containing 2.9 mol % of Boc-protected guanidine side chains. Boc-deprotection was accomplished by stirring the polymer as a solution in $CH_2Cl_2$ with concentrated acid $HBr_{(aq)}$ or $HI_{(aq)}$, followed by precipitation into a mixture of 15% v/v 1 M $HX_{(aq)}$ (X=Br or I) in MeOH to give the guanidinium salts (PBMA-GuaHX, X=Br or I).

The PBMA-$NH_3$X and PBMA-GuaHX were used in conjunction with ammonium-capped or cesium oleate-capped $CsPbBr_3$ NCs using toluene or chloroform as dispersant (i.e., both sets of ligand exchange/color tuning conditions). Combining $CsPbBr_3$ NCs with PBMA-$NH_3$I or PBMA-Gua HI gave brightly emitting solutions at ~646 or 636 nm, respectively.

Thus, polymer-based ammonium halide or guanidinium halide salts, prepared by emulsion polymerization, proved capable of functioning as ligands for $CsPbX_3$ PNCs and for boosting their PLQY values. For $CsPbBr_3$, a broad range of color tunability was observed, from 440-660 nm, which led to the formation of water-stable, PL emissive films. Embedding the halide source as ammonium groups in macromolecular ligands imparts a new route to control inter-PNC halide exchange kinetics based on diffusion of the polymer chains and their solvent-responsive aggregation. Such aggregation inhibited halide exchange in the perovskite NCs in solvents such as cyclohexane, which in turn produced a stable co-existence of $CsPbX_3$ perovskite NCs with different halide compositions. This advantageously represents a completely solution processable route to all-perovskite NC, white light-emitting films.

This disclosure further encompasses the following aspects.

Aspect 1: A composition comprising: a plurality of lead halide nanocrystals; and an ammonium halide-containing copolymer comprising 1 to 10 mole percent of ammonium halide-containing repeating units or a guanidinium halide-containing copolymer comprising 1 to 10 mole percent of guanidinium halide-containing repeating units.

Aspect 2: The composition of aspect 1, wherein the ammonium halide-containing copolymer or the guanidinium halide-containing copolymer is present as a coating on a surface of the lead halide perovskite nanocrystals.

Aspect 3: The composition of aspect 1 or 2, wherein the composition comprises a halide exchange reaction product of the lead halide perovskite nanocrystals and the ammonium halide-containing copolymer or the guanidinium halide-containing copolymer.

Aspect 4: The composition of any of aspects 1 to 3, wherein the lead halide nanocrystals are of the formula $APbX_3$, $APb_2X_5$, $A_4PbX_6$, or a combination thereof, wherein A is a metal cation, an organic cation, or a combination thereof and X is a halide, preferably wherein the lead halide perovskite nanocrystals are of the formula $APbX_3$.

Aspect 5: The composition of any of aspects 1 to 4, wherein the lead halide nanocrystals are of the formula $CsPbX_3$ wherein X is Br, Cl, I, or a combination thereof.

Aspect 6: The composition of any of aspects 1 to 5, comprising the ammonium halide-containing copolymer, wherein the ammonium halide-containing copolymer comprises repeating units according to Formula I and Formula II, preferably, wherein $R^1$ is hydrogen, n and m are each 0, q is 1, and L is a $C_{1-6}$ alkylene linking group, more preferably, wherein the ammonium halide-containing copolymer comprises repeating units according to Formula IB and IIA.

Aspect 7: The composition of any of aspects 1 to 5, comprising the ammonium halide-containing copolymer, wherein the ammonium halide-containing copolymer comprises repeating units according to Formula VIII and Formula IX, preferably, wherein $R^1$ is methyl, L is a $C_{1-6}$ alkylene linking group, preferably a butylene group, $R^6$ is a $C_{1-6}$ alkyl group, preferably a butyl group, and IV', $R_y$, and $R^z$ are each independently hydrogen or a $C_{1-8}$ alkyl group, preferably hydrogen.

Aspect 8: The composition of any of aspects 1 to 5, comprising the guanidinium halide-containing copolymer, wherein the guanidinium halide-containing copolymer comprises repeating units according to Formula (VIII) and (X), preferably wherein each occurrence of $R^1$ is methyl, $R^6$ is a butyl group, and L is an ethylene group, more preferably wherein the guanidinium halide-containing polymer comprises repeating units according to Formula (VIIIa) and (Xa).

Aspect 9: The composition of any of aspects 1 to 8, further comprising an organic solvent.

Aspect 10: The composition of any of aspects 1 to 8, wherein the composition is in the form of a film.

Aspect 11: The composition of aspect 10, wherein the film further comprises a second polymer different from the ammonium halide-containing copolymer or the guanidinium halide-containing copolymer.

Aspect 12: The composition of any of aspects 1 to 8, wherein the composition is in the form of a powder.

Aspect 13: The composition of aspect 1, comprising a lead bromide nanocrystal, preferably $CsPbBr_3$; and a first ammonium halide-containing copolymer comprising repeating units according to Formula II, wherein X is Cl.

Aspect 14: The composition of aspect 13, further comprising a second ammonium halide-containing copolymer comprising repeating units according to Formula II, wherein X is Br, preferably wherein the first and second ammonium halide-containing copolymers are present in a weight ratio of 1:1.

Aspect 15: The composition of aspect 1, comprising a lead halide nanocrystal, preferably $CsPbBr_3$ or $CsPbBr_{1.5}I_{1.5}$; and a first ammonium halide-containing copolymer comprising repeating units according to Formula II, wherein X is Br.

Aspect 16: The composition of aspect 15, further comprising a second ammonium halide-containing copolymer comprising repeating units according to Formula II, wherein X is I, preferably wherein the first and second ammonium halide-containing copolymers are present in a weight ratio of 1:1.

Aspect 17: The composition of aspect 1, comprising a lead halide nanocrystal, preferably $CsPbBr_3$ or $CsPbBr_{1.5}I_{1.5}$; a first ammonium halide-containing copolymer comprising repeating units according to Formula II, wherein X is I.

Aspect 18: The composition of any of aspects 1 to 17, wherein the plurality of lead halide nanocrystals comprises $CsPbBr_{1.5}Cl_{1.5}$, $CsPbBr_3$, and $CsPbBrI_2$.

Aspect 19: The composition of aspect 18, wherein the composition comprises an ammonium halide-containing copolymer comprising repeating units according to Formula II, wherein X is Br; or an ammonium halide-containing copolymer comprising repeating units according to Formula II, wherein X is Br, and a second ammonium halide-containing copolymer comprising repeating units according to Formula II, wherein X is Cl, preferably wherein the first and the second ammonium halide-containing copolymer are present in a 1:1 weight ratio; or a first ammonium halide-containing copolymer comprising repeating units according to Formula II, wherein X is Br, and a second ammonium halide-containing copolymer comprising repeating units according to Formula II, wherein X is I, preferably wherein the first and the second ammonium halide-containing copolymer are present in a 1:2 weight ratio.

Aspect 20: The composition of any of aspects 1 to 19, wherein a solution comprising the composition exhibits an increase in photoluminescence quantum yield of at least 20% compared to the lead halide nanocrystals not including the ammonium-halide containing copolymer or the guanidinium halide-containing copolymer.

Aspect 21: The composition of any of aspects 1 to 20, wherein the composition comprises an aggregate comprising a perovskite nanocrystal surrounded by one or more polymer chains.

Aspect 22: A method of making a composition, the method comprising: combining a plurality of lead halide nanocrystals; and an ammonium halide-containing copolymer comprising ammonium-halide containing repeating units in an amount of 1 to 10 mole percent or a guanidinium halide-containing copolymer comprising guanidinium-halide containing repeating units in an amount of 1 to 10 mole percent, under conditions effective to provide the composition.

Aspect 23: The method of aspect 22, wherein the combining is in the presence of a solvent, preferably an aliphatic organic solvent.

Aspect 24: The method of aspect 22 or 23, further comprising forming a film.

Aspect 25: A light emitting device comprising: a first electrode; a second electrode; and a light emitting layer between the first electrode and the second electrode, wherein the light emitting layer comprises the composition of any of aspects 1 to 21.

Aspect 26: The light emitting device of aspect 25, wherein the light emitting device is a light emitting diode.

The compositions, methods, and articles can alternatively comprise, consist of, or consist essentially of, any appropriate materials, steps, or components herein disclosed. The compositions, methods, and articles can additionally, or alternatively, be formulated so as to be devoid, or substantially free, of any materials (or species), steps, or components, that are otherwise not necessary to the achievement of the function or objectives of the compositions, methods, and articles.

All ranges disclosed herein are inclusive of the endpoints, and the endpoints are independently combinable with each other. "Combinations" is inclusive of blends, mixtures, alloys, reaction products, and the like. The terms "first," "second," and the like, do not denote any order, quantity, or importance, but rather are used to distinguish one element from another. The terms "a" and "an" and "the" do not denote a limitation of quantity, and are to be construed to cover both the singular and the plural, unless otherwise indicated herein or clearly contradicted by context. "Or" means "and/or" unless clearly stated otherwise. Reference throughout the specification to "an aspect" means that a particular element described in connection with the aspect is included in at least one aspect described herein, and may or may not be present in other aspects. The term "combination thereof" as used herein includes one or more of the listed elements, and is open, allowing the presence of one or more like elements not named. In addition, it is to be understood that the described elements may be combined in any suitable manner in the various aspects.

Unless specified to the contrary herein, all test standards reflect standard practices in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this application belongs. All cited patents, patent applications, and other references are incorporated herein by reference in their entirety. However, if a term in the present application contradicts or conflicts with a term in the incorporated reference, the term from the present application takes precedence over the conflicting term from the incorporated reference.

Compounds are described using standard nomenclature. For example, any position not substituted by any indicated group is understood to have its valency filled by a bond as indicated, or a hydrogen atom. A dash ("—") that is not between two letters or symbols is used to indicate a point of attachment for a substituent. For example, —CHO is attached through carbon of the carbonyl group.

As used herein, the term "hydrocarbyl", whether used by itself, or as a prefix, suffix, or fragment of another term, refers to a residue that contains only carbon and hydrogen. The residue can be aliphatic or aromatic, straight-chain, cyclic, bicyclic, branched, saturated, or unsaturated. It can also contain combinations of aliphatic, aromatic, straight chain, cyclic, bicyclic, branched, saturated, and unsaturated hydrocarbon moieties. However, when the hydrocarbyl residue is described as substituted, it may, optionally, contain heteroatoms over and above the carbon and hydrogen members of the substituent residue. Thus, when specifically described as substituted, the hydrocarbyl residue can also contain one or more carbonyl groups, amino groups, hydroxyl groups, or the like, or it can contain heteroatoms within the backbone of the hydrocarbyl residue. The term "alkyl" means a branched or straight chain, saturated aliphatic hydrocarbon group, e.g., methyl, ethyl, n-propyl, i-propyl, n-butyl, s-butyl, t-butyl, n-pentyl, s-pentyl, and n- and s-hexyl. "Alkenyl" means a straight or branched chain, monovalent hydrocarbon group having at least one carbon-carbon double bond (e.g., ethenyl ($—HC{=}CH_2$)). "Alkoxy" means an alkyl group that is linked via an oxygen (i.e., alkyl-O—), for example methoxy, ethoxy, and sec-butyloxy groups. "Alkylene" means a straight or branched chain, saturated, divalent aliphatic hydrocarbon group (e.g., methylene ($—CH_2—$) or, propylene ($—(CH_2)_3—$)). "Cycloalkylene" means a divalent cyclic alkylene group, $—C_nH_{2n-x}$, wherein x is the number of hydrogens replaced by cyclization(s). "Cycloalkenyl" means a monovalent group having one or more rings and one or more carbon-carbon double bonds in the ring, wherein all ring members are carbon (e.g., cyclopentyl and cyclohexyl). “Aryl” means an aromatic hydrocarbon group containing the specified number of carbon atoms, such as phenyl, tropone, indanyl, or naphthyl. “Arylene” means a divalent aryl group. “Alkylarylene” means an arylene group substituted with an alkyl group. “Arylalkylene” means an alkylene group substituted with an aryl group (e.g., benzyl). The prefix “halo” means a group or compound including one more of a fluoro, chloro, bromo, or iodo substituent. A combination of different halo atoms (e.g., bromo and fluoro), or only chloro atoms can be present. The prefix “hetero” means that the compound or group includes at least one ring member that is a heteroatom (e.g., 1, 2, or 3 heteroatom(s)), wherein the heteroatom(s) is each independently N, O, S, Si, or P. “Substituted” means that the compound or group is substituted with at least one (e.g., 1, 2, 3, or 4) substituents that can each independently be a $C_{1-9}$ alkoxy, a $C_{1-9}$ haloalkoxy, a nitro ($—NO_2$), a cyano (—CN), a $C_{1-6}$ alkyl sulfonyl ($—S(=O)_2$-alkyl), a $C_{6-12}$ aryl sulfonyl ($—S(=O)_2$-aryl), a thiol (—SH), a thiocyano (—SCN), a tosyl ($CH_3C_6H_4SO_2—$), a $C_{3-12}$ cycloalkyl, a $C_{2-12}$ alkenyl, a $C_{5-12}$ cycloalkenyl, a $C_{6-12}$ aryl, a $C_{7-13}$ arylalkylene, a $C_{4-12}$ heterocycloalkyl, and a $C_{3-12}$ heteroaryl instead of hydrogen, provided that the substituted atom’s normal valence is not exceeded. The number of carbon atoms indicated in a group is exclusive of any substituents. For example $—CH_2CH_2CN$ is a $C_2$ alkyl group substituted with a nitrile.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A composition comprising:

a plurality of lead halide nanocrystals; and an ammonium halide-containing copolymer comprising 1 to 10 mole percent of ammonium halide-containing repeating units or a guanidinium halide-containing copolymer comprising 1 to 10 mole percent of guanidinium halide-containing repeating units;

wherein the ammonium halide-containing copolymer comprises repeating units according to Formula I and Formula II (I)

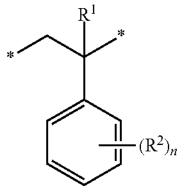

(II)

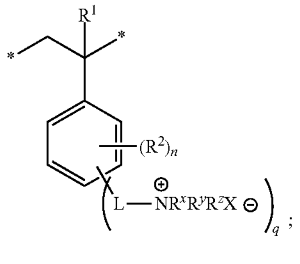

or repeating units according to Formula (VIII) and Formula (IX)

(VIII)

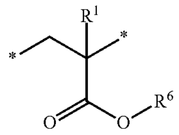

(IX)

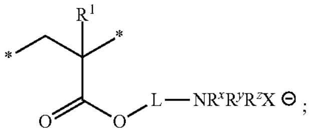

wherein in the foregoing formulas $R^1$ is independently at each occurrence hydrogen or a $C_{1-8}$ alkyl group;

$R^2$ is independently at each occurrence a $C_1$-$C_8$ alkyl group, or a $C_2$-$C_8$ alkenyl group;

$R^6$ is a substituted or unsubstituted $C_{1-20}$ alkyl group;

L is a linking group;

$R^x$, $R^y$, and $R^z$ each independently comprise hydrogen, a substituted or unsubstituted $C_1$-$C_8$ alkyl group, or a substituted or unsubstituted $C_2$-$C_8$ alkenyl group;

X is a Br, Cl, I, or a combination thereof;

n is 0 to 5;

m is 0 to 4; and q is 1 to 5.

2. The composition of claim 1, wherein the ammonium halide-containing copolymer or guanidinium halide-containing copolymer is present as a coating on a surface of the lead halide perovskite nanocrystals.

3. The composition of claim 1, wherein the composition comprises a halide exchange reaction product of the lead halide nanocrystals and the ammonium halide-containing copolymer or the guanidinium halide-containing copolymer.

4. The composition of claim 1, wherein the lead halide nanocrystals are of the formula $APbX_3$, $APb_2X_5$, $A_4PbX_6$, or a combination thereof, wherein A is a metal cation, an organic cation, or a combination thereof and X is a halide.

5. The composition of claim 1, wherein the lead halide nanocrystals are of the formula $CsPbX_3$ wherein X is Br, Cl, I, or a combination thereof.

6. The composition of claim 1, wherein the ammonium halide-containing copolymer is present and comprises repeating units according to Formula I and Formula II.

7. The composition of claim 1, wherein the ammonium halide-containing copolymer is present and comprises repeating units according to Formula (VIII) and Formula (IX).

8. The composition of claim 1, wherein the guanidinium halide-containing copolymer is present and comprises repeating units according to Formula (VIII) and (X)

(VIII)

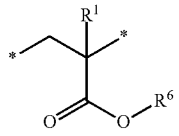

-continued (X)

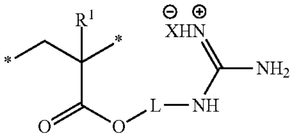

wherein, in Formula (VIII) and Formula (X), $R^1$ is independently at each occurrence hydrogen or a $C_{1-8}$ alkyl group;

$R^6$ is a substituted or unsubstituted $C_{1-20}$ alkyl group;

L is a linking group; and

X is a Br, Cl, I, or a combination thereof.

9. The composition of claim 1, wherein the composition is in the form of a film or a powder, optionally wherein the composition film further comprises a second polymer different from the ammonium halide-containing copolymer or the guanidium halide-containing copolymer.

10. The composition of claim 1, comprising a lead bromide perovskite nanocrystal; and a first ammonium halide-containing copolymer comprising repeating units according to Formula I and Formula II, wherein X is Cl.

11. The composition of claim 10, further comprising a second ammonium halide-containing copolymer comprising repeating units according to Formula I and Formula II, wherein X is Br.

12. The composition of claim 1, comprising a lead halide perovskite nanocrystal; and a first ammonium halide-containing copolymer comprising repeating units according to Formula I and Formula II, wherein X is Br.

13. The composition of claim 12, further comprising a second ammonium halide-containing copolymer comprising repeating units according to Formula I and Formula II, wherein X is I.

14. The composition of claim 1, comprising a lead halide perovskite nanocrystal;

a first ammonium halide-containing copolymer comprising repeating units according to Formula I and Formula II, wherein X is I.

15. The composition of claim 1, wherein the plurality of lead halide perovskite nanocrystals comprises $CsPbBr_{1.5}Cl_{1.5}$, $CsPbBr_3$, and $CsPbBrI_2$.

16. The composition of claim 15, wherein the composition comprises an ammonium halide-containing copolymer comprising repeating units according to Formula I and Formula II, wherein X is Br; or an ammonium halide-containing copolymer comprising repeating units according to Formula I and Formula II, wherein X is Br, and a second ammonium halide-containing copolymer comprising repeating units according to Formula I and Formula II, wherein X is Cl; or a first ammonium halide-containing copolymer comprising repeating units according to Formula I and Formula II, wherein X is Br, and a second ammonium halide-containing copolymer comprising repeating units according to Formula I and Formula II, wherein X is I.

17. The composition of claim 1, wherein a solution comprising the composition exhibits an increase in photoluminescence quantum yield of at least 20% compared to the lead halide nanocrystals not including the ammonium halide-containing copolymer or the guanidinium halide-containing copolymer.

18. The composition of claim 1, wherein the composition comprises an aggregate comprising a nanocrystal surrounded by one or more polymer chains.

19. A method of making a composition, the method comprising:

combining a plurality of lead halide nanocrystals; and an ammonium halide-containing copolymer comprising ammonium-halide containing repeating units in an amount of 1 to 10 mole percent or a guanidinium halide-containing copolymer comprising guanidinium halide-containing repeating units in an amount of 1 to 10 mole percent, under conditions effective to provide the composition;

wherein the ammonium halide-containing copolymer comprises repeating units according to Formula I and Formula II (I)

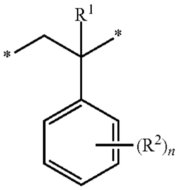

(II)

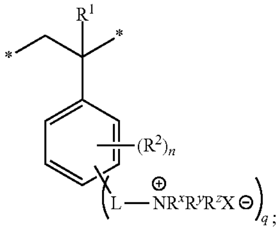

; or repeating units according to Formula (VIII) and Formula (IX)

(VIII)

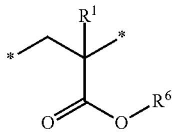

(IX)

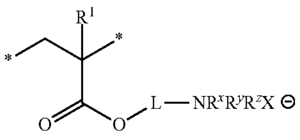

wherein in the foregoing formulas $R^1$ is independently at each occurrence hydrogen or a $C_{1-8}$ alkyl group;

$R^2$ is independently at each occurrence a $C_1$-$C_8$ alkyl group, or a $C_2$-$C_8$ alkenyl group;

$R^6$ is a substituted or unsubstituted $C_{1-20}$ alkyl group;

L is a linking group;

$R^x$, $R^y$, and $R^z$ each independently comprise hydrogen, a substituted or unsubstituted $C_1$-$C_8$ alkyl group, or a substituted or unsubstituted $C_2$-$C_8$ alkenyl group;

X is a Br, Cl, I, or a combination thereof;

n is 0 to 5;

m is 0 to 4; and q is 1 to 5.

20. A light emitting device comprising:

a first electrode;

a second electrode; and a light emitting layer between the first electrode and the second electrode, wherein the light emitting layer comprises the composition of claim 1.

* * * * *